United States Patent [19]

Ohsawa

[11] Patent Number: 5,381,373
[45] Date of Patent: Jan. 10, 1995

[54] VOLTAGE STRESS TEST CIRCUIT FOR A DRAM

[75] Inventor: Takashi Ohsawa, Yokohama, Japan

[73] Assignee: Kabushiki Kaisha Toshiba, Japan

[21] Appl. No.: 75,313

[22] Filed: Jun. 11, 1993

[30] Foreign Application Priority Data

Jun. 12, 1992 [JP] Japan .................................. 4-153482
Jun. 12, 1992 [JP] Japan .................................. 4-153485

[51] Int. Cl.$^6$ ............................................. G11C 7/00
[52] U.S. Cl. .................................. 365/201; 365/193;
365/222; 365/236
[58] Field of Search .................. 365/201, 189.01, 222,
365/193, 236

[56] References Cited

U.S. PATENT DOCUMENTS 5,249,155  9/1993  Arimoto et al. ...................... 365/201
5,258,954 11/1993  Furuyama ............................ 365/201

*Primary Examiner*—Eugene R. LaRoche
*Assistant Examiner*—F. Niranjan
*Attorney, Agent, or Firm*—Banner, Birch, McKie & Beckett

[57] ABSTRACT

A semiconductor memory device includes a circuit for generating a voltage stress mode signal on the basis of a predetermined signal used in a normal operation of a DRAM circuit, and a control circuit for receiving the test mode signal from the generating circuit and performing control such that, in an AC voltage stress test mode, upper bits, of an output signal from a refresh address counter, which are more significant than a specific bit are fixed at the same level, and lower bits less significant than the specific bit are subjected to a normal count operation and such that, in a DC voltage stress test mode, all the bits of an output signal from the refresh address counter are fixed at the same level so as to cause a word line driving circuit to simultaneously drive all the word lines. In setting a desired AC/DC voltage stress mode for a DRAM in a wafer state or a package state, no special voltage stress test pads are required, and the number of circuits other than the circuit required for the normal mode can be minimized, thereby reducing an increase in chip area. In addition, in the AC mode, any failure mode such as a decrease in breakdown voltage between adjacent word lines or adjacent bit lines can be simultaneously screened.

17 Claims, 22 Drawing Sheets

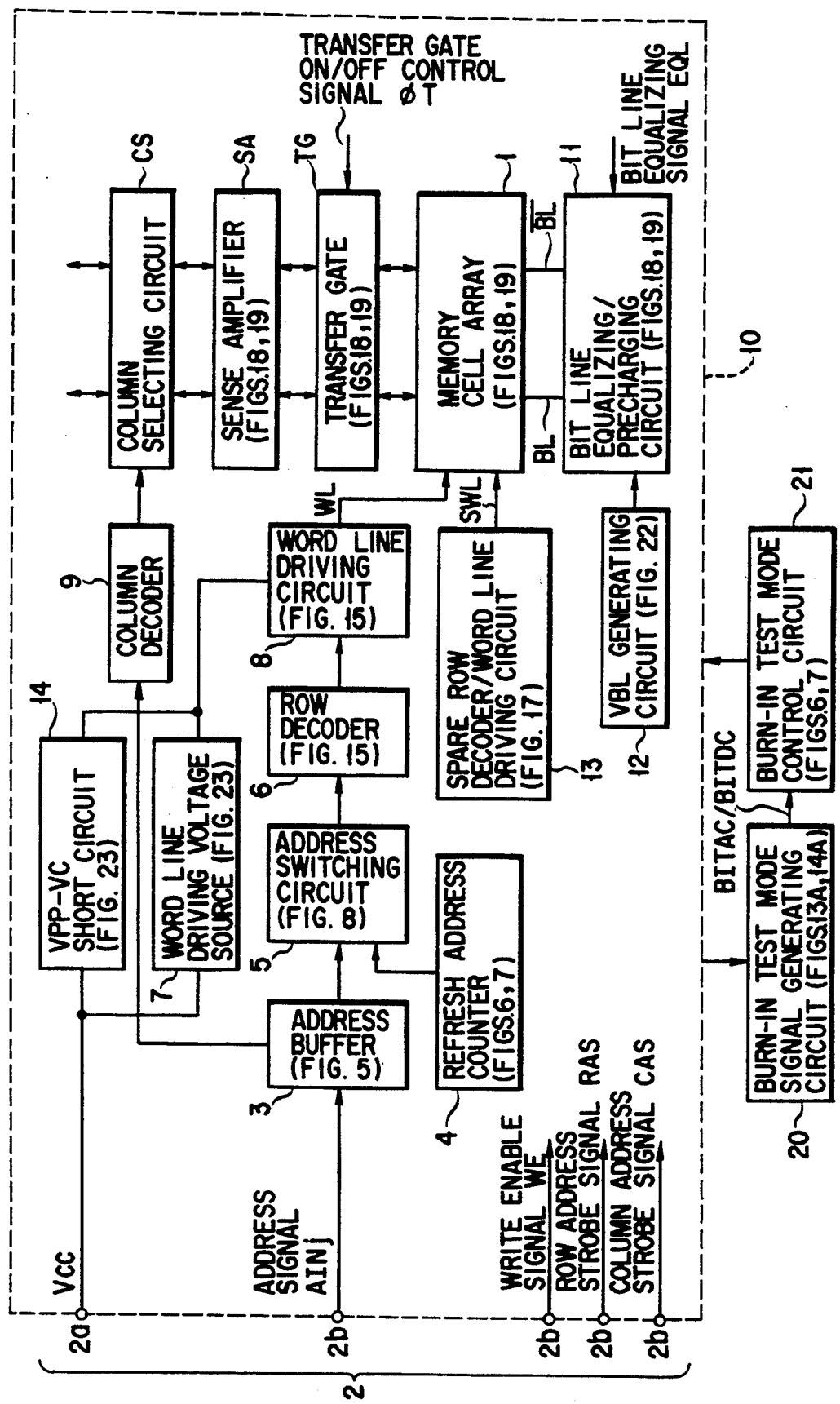
F I G. 4

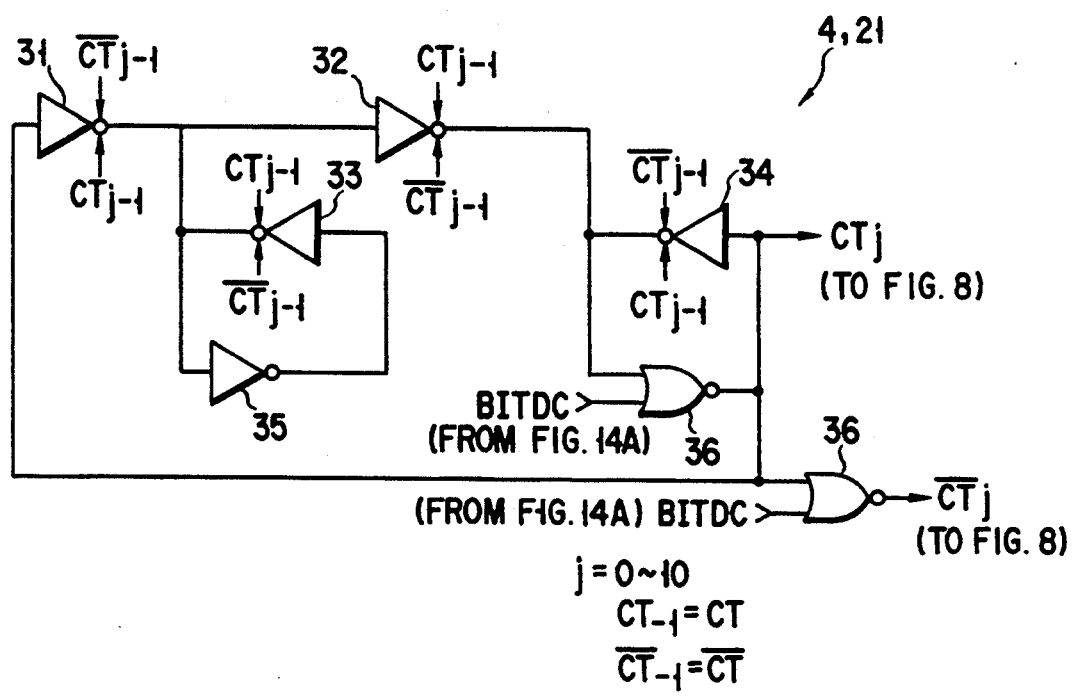
F I G. 7
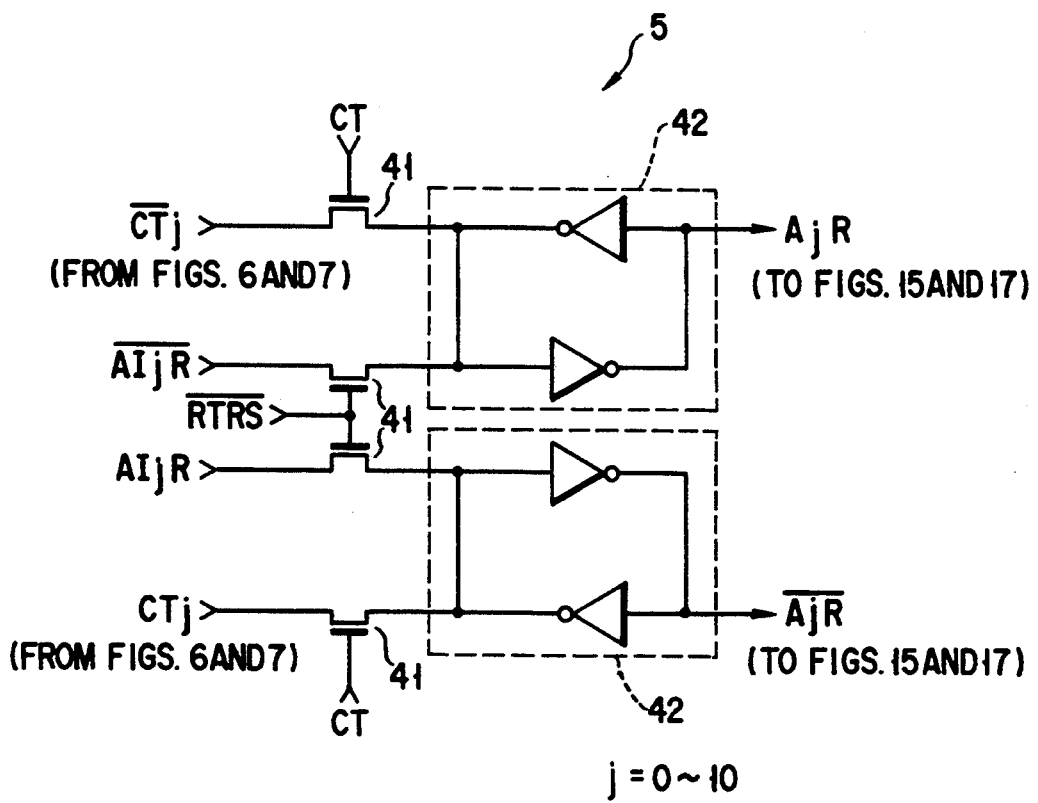
F I G. 8

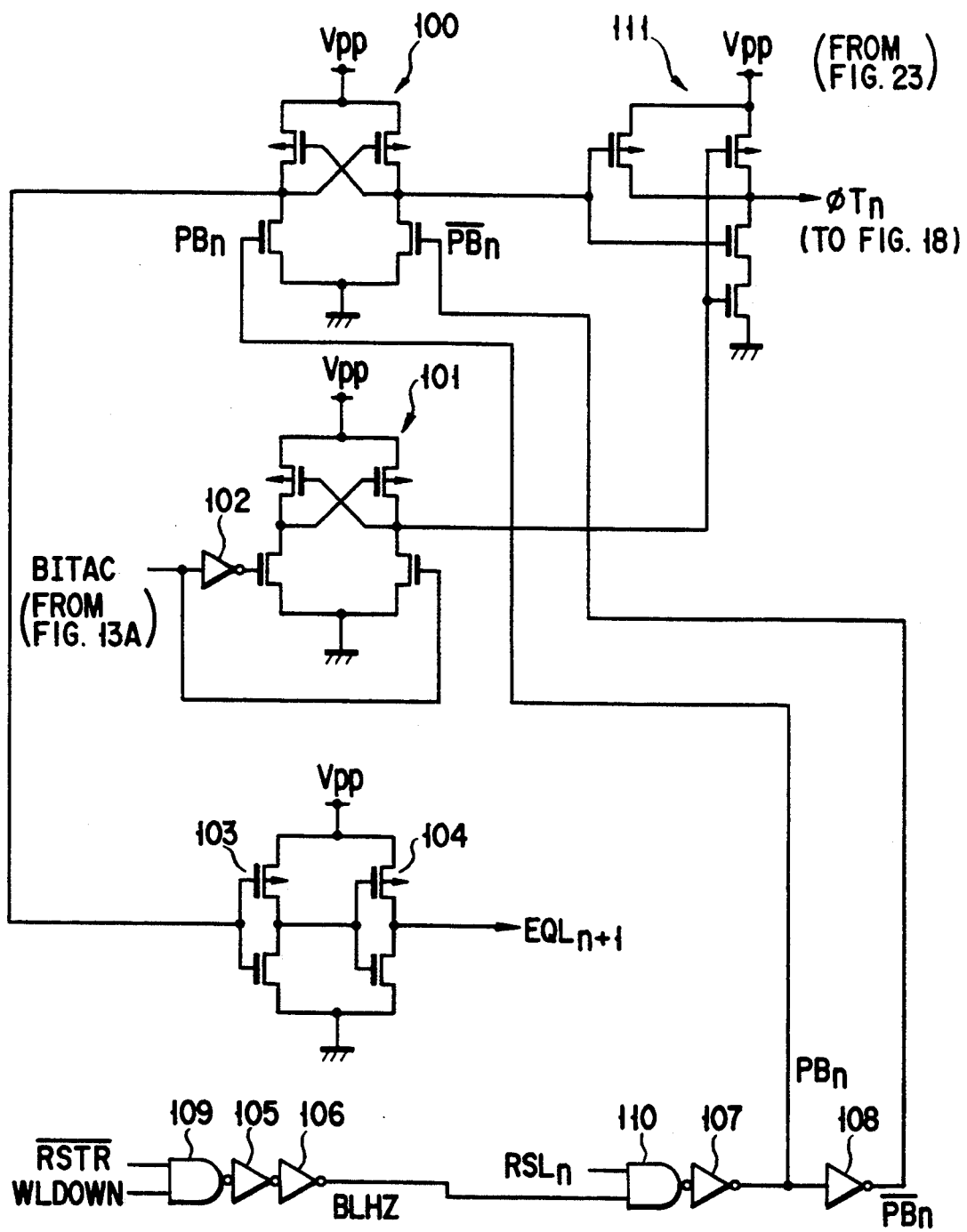
F I G. 20

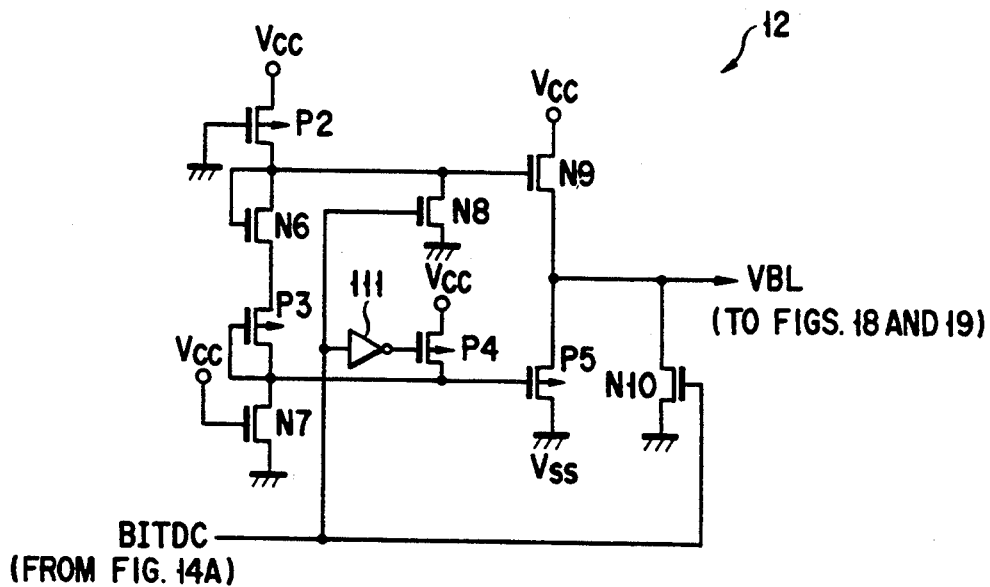
F I G. 22
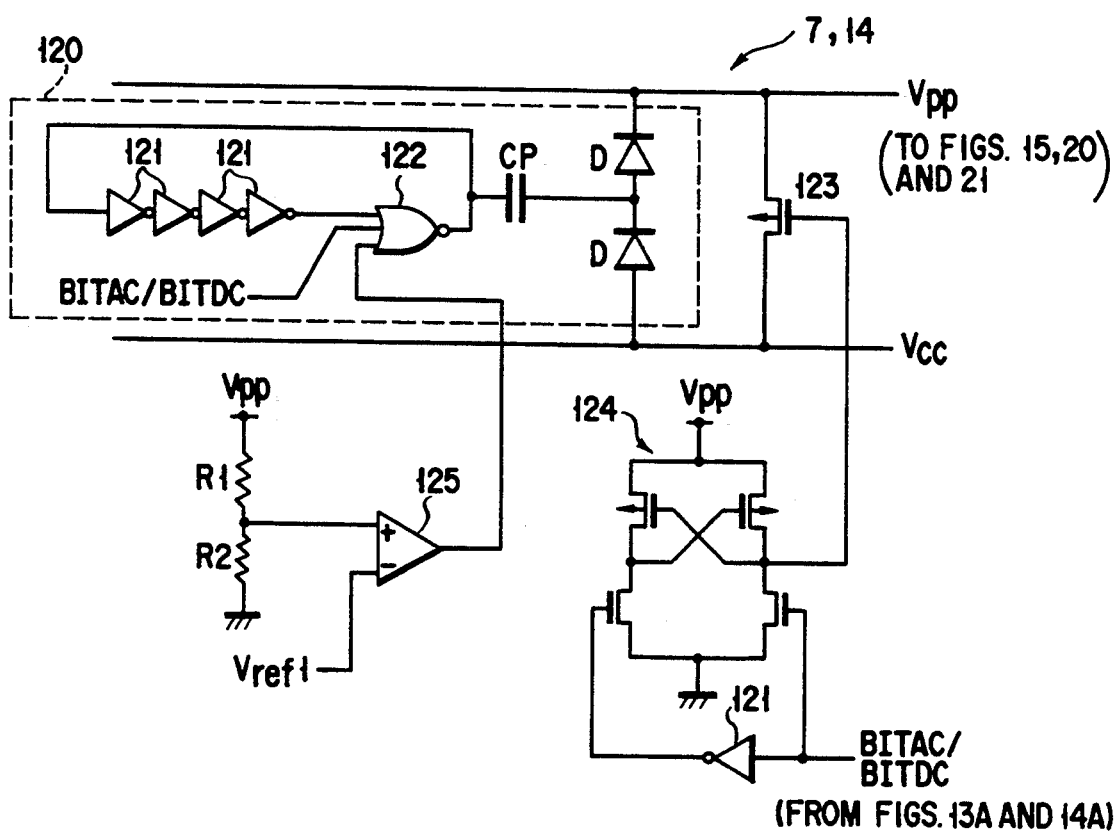
F I G. 23

VOLTAGE STRESS TEST CIRCUIT FOR A DRAM

BACKGROUND OF THE INVENTION

1. Field of the Invention

The present invention relates to a semiconductor memory device and, more particularly, to a circuit for performing a voltage stress test with respect to a DRAM (dynamic random-access memory).

2. Description of the Related Art

In a DRAM, the highest electric field (voltage stress) is applied to the gate insulating film of the transfer gate transistor (cell transistor) of each memory cell having a gate electrode to which a word line is connected. Consequently, there is a high probability that a reliability problem may occur at the gate insulating film. In addition, the refresh cycle is doubled every time devices of a new generation are developed. For this reason, in repeating a normal cycle, the duty ratio at which a high electric field is applied to the word lines is reduced to half for each coming generation.

In a conventional burn-in test of a DRAM, an electric field applied to the gate insulating film of each cell transistor is accelerated by boosting a supply voltage. Since the word lines are sequentially selected, it takes too much time to perform screening of the gate insulating film of each cell transistor. If, therefore, the total time required to screen the gate insulating film of each cell transistor is kept constant even with a change in generation of DRAMs, the burn-in test time is doubled for each coming generation.

Under the circumstances, there is an increasing demand to shorten the burn-in test time of a DRAM. As a measure to meet this demand, it is proposed that a DRAM incorporate a mode in which a larger number of word lines are simultaneously selected than in a normal operation, and a DC voltage is applied to the selected word lines. This mode will be referred to as a quick DC burn-in test mode in order to discriminate it from the conventional normal burn-in test mode. According to a means for realizing this quick DC burn-in test mode, special voltage stress test pads which are not used in a normal operation are additionally arranged on a chip, and a stress voltage is applied to the pads in a burn-in test, thereby simultaneously selecting word lines larger in number than those selected in a normal operation. In this state, a burn-in test is performed.

However, in the burn-in test mode using the above-mentioned special voltage stress test pads, a voltage stress test cannot be performed with respect to a DRAM sealed in a package. In consideration of such a situation, for example, Japanese Patent Application No. 4-225182 discloses a means for realizing a quick DC burn-in test mode. According to this means, by inputting an external control signal, signals on the input or outside side of a word line selection circuit are forcibly controlled to a constant level to simultaneously select all the word lines, thus performing a burn-in test in this state. With this operation, no special voltage stress test pads are required, and the DC burn-in test mode can be set in a wafer state or a packaged state. In a circuit arrangement for setting the quick DC burn-in test mode by externally inputting a control signal, as described above, the number of circuits other than those required for the normal operation mode is preferably minimized to suppress an increase in chip area. In addition, in setting the quick DC burn-in test mode, not only a row decoder but also other circuits must or preferably be controlled simultaneously. There are demands for practical measures to meet these requirements.

On the other hand, a decrease in breakdown voltage between adjacent word lines due to dust must be screened in advance. For example, Japanese Patent Application No. 2-418374 discloses a mode in which the word lines of a word line array are divided into two groups, i.e., an even-numbered word line group and an odd-numbered word line group, and high voltages are simultaneously applied to the two groups, thereby performing a burn-in test by applying a sufficient voltage between adjacent word lines. This mode will be referred to as a quick AC burn-in test mode hereinafter.

FIGS. 1 to 3 show circuits for realizing the quick AC burn-in test mode disclosed in Japanese Patent Application No. 2-418374. The circuit shown in FIG. 1 is used in a DRAM of a bootstrap word line driving scheme, in which a control clock signal $\phi_{BOOT}$ is caused to rise in the burn-in test mode to transfer charges, prestored in a bootstrap capacitor $C_{BOOT}$, to selected word lines WL0i to WLi through n-channel MOS transistors 140 to 142. In the AC burn-in test mode, some of bits A0 to An of an address signal are set at "L" level in both "true and complementary" signals so as to simultaneously select a plurality of NOR type decoders 144 or 145, thereby simultaneously applying a voltage stress to word lines which are not adjacent to each other. In this case, the potential of a bit line BL is fixed at the ground potential through a transfer gate 146 and a pad 147 controlled by a bit line precharging signal $\phi_{PRE}$. In each of the circuits shown in FIGS. 2 and 3, special voltage stress test pads 148 to 150 are arranged, and a transfer gate 151 or 152 is connected to one end of each of all word lines WL0i, WL1i, . . . The transfer gates 151 and 152 are selectively driven to select the even-numbered or odd-numbered word line group of the word line array, thereby simultaneously applying a voltage stress to the selected word line group (every other word line in the word line array) through the pad connected to the other end of each of the selected word lines. However, in the burn-in test mode using the special voltage stress test pads, shown in FIGS. 1 to 3, a voltage stress test cannot be performed with respect to a DRAM sealed in a package. In the circuits shown in FIGS. 1 to 3, in realizing the quick AC burn-in test mode, since a normal operation (DRAM operation) cannot be performed, failure modes which can occur in a normal operation but are difficult to predict, such as a decrease in breakdown voltage between adjacent bit lines, cannot be screened in advance.

In order to set the quick DC burn-in test mode in wafer state or a packaged state of a DRAM without requiring special voltage stress test pads, as disclosed in Japanese Patent Application No. 2-418371, a burn-in test must be performed while signals on the input or output side of a word line selecting circuit are forcibly controlled to a constant level by externally inputting a control signal, and a larger number of word lines are simultaneously selected than in a normal operation. As described above, in a circuit arrangement for setting the quick burn-in test mode by externally inputting a control signal, the number of circuits other than those required for the normal operation mode is preferably minimized to reduce an increase in chip area. In addition, in setting the quick burn-in test mode, not only a row decoder but also other circuits must or preferably be controlled simultaneously. Demands have arisen for practical measures to meet these requirements.

SUMMARY OF THE INVENTION

The present invention has been made in consideration of the above situation, and has as its object to provide a semiconductor memory device in which the AC voltage stress test mode, in which the duty ratio at which a high voltage is applied to word lines in a wafer state or a packaged state is high, can be set, without using special voltage stress test pads, to minimize the number of circuits other than those required for a normal operation so as to reduce an increase in chip area, and failure modes which can occur in a normal operation but are difficult to predict, such as a decrease in breakdown voltage between adjacent word lines or adjacent bit lines, can be simultaneously screened by operating the device in substantially the same manner as in a normal operation.

It is another object of the present invention to provide a semiconductor memory device in which the DC voltage stress test mode can be set, without using special voltage stress test pads, to minimize the number of circuits other than those required for a normal operation so as to reduce an increase in chip area.

According to an aspect of the present invention, a semiconductor memory device comprises a DRAM circuit, a voltage stress test mode signal generating circuit for generating a voltage stress test mode signal on the basis of a predetermined signal input through some of external terminals used in a normal operation of the DRAM circuit, and a control circuit for receiving the test mode signal from the voltage stress test mode signal generating circuit, and performing control such that a plurality of bits of an output signal from a refresh address counter of the DRAM circuit are fixed at the same level, and bits other than the plurality of bits are subjected to a normal count operation.

According to another aspect of the present invention, a semiconductor memory device comprises a DRAM circuit, a voltage stress test mode signal generating circuit for generating a voltage stress test mode signal on the basis of a predetermined signal input through some of external terminals used in a normal operation of the DRAM circuit, and a control circuit for receiving the test mode signal from the voltage stress test mode signal generating circuit, and performing control such that upper bits, of an output signal from a refresh address counter of the DRAM circuit, which are more significant than a specific bit are fixed at the same level, and lower bits which are less significant than the specific bit are subjected to a normal count operation.

According to still another aspect of the present invention, a semiconductor memory device comprises a DRAM circuit, a voltage stress test mode signal generating circuit for generating a voltage stress test mode signal on the basis of a predetermined signal input through some of external terminals used in a normal operation of the DRAM circuit, and a control circuit for receiving the test mode signal from the voltage stress test mode signal generating circuit, and performing control such that all bits of an output signal from a refresh address counter of the DRAM circuit are fixed at the same level so as to cause a word line driving circuit of the DRAM circuit to simultaneously drive all word lines.

A voltage stress test mode signal is generated on the basis of a predetermined signal input through some of external terminals used in a normal operation of the DRAM circuit. Upon reception of this signal, only the upper bits of an output signal from the refresh address counter are fixed at the same level. In this case, since the lower bits of the output signal from the refresh address counter change in accordance with a counter operation, the AC voltage stress test mode can be set, in which the duty ratio at which a high voltage is applied to the word lines of the DRAM circuit is higher than that in a normal operation. Therefore, a decrease in breakdown voltage at the insulating film of the transfer gate of each memory cell can be screened in a short period of time. In addition, a voltage stress test mode signal is generated on the basis of a predetermined signal input through some of external terminals used in a normal operation of the DRAM circuit. Upon reception of this signal, all the bits of each of complementary output signals from the refresh address counter are fixed at the same level. With this operation, a desired voltage test mode (e.g., the quick DC burn-in test mode) can be set. As described above, no special pads are required to set a voltage stress test mode, and a voltage stress test mode can be set in a wafer state or a packaged state of a DRAM. In addition, the number of circuits other than those required for a normal operation can be minimized to reduce an increase in chip area. Furthermore, by performing substantially the same operation as a normal DRAM operation, failure modes which can occur in a normal operation but are difficult to predict, such as a decrease in breakdown voltage between adjacent word lines or adjacent bit lines, can be simultaneously screened. In this case, "substantially the same operation" means that the screening time is shortened by simultaneously selecting word lines in memory cell blocks which are considered to be independent with respect to a breakdown voltage reduction failure mode because the word lines of the respective blocks are sufficiently spaced apart from each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram showing part of a DRAM incorporating an AC/DC burn-in test mode according to the first embodiment of the present invention;

FIG. 7 is a circuit diagram showing the one-stage portion of the refresh address counter and part of a DC burn-in test mode control circuit in FIG. 4;

FIG. 8 is a circuit diagram showing part of an address switching circuit in FIG. 4;

FIG. 20 is a circuit diagram showing a signal generating circuit for generating signals $\phi T$ and EQL in FIG. 18;

FIG. 22 is a circuit diagram showing a VBL generating circuit in FIG. 4;

FIG. 23 is a circuit diagram showing a word line driving voltage source and a VPP-VCC short circuit in FIG. 4;

DETAILED DESCRIPTION OF THE PREFERRED EMBODIMENTS

Figure 1:
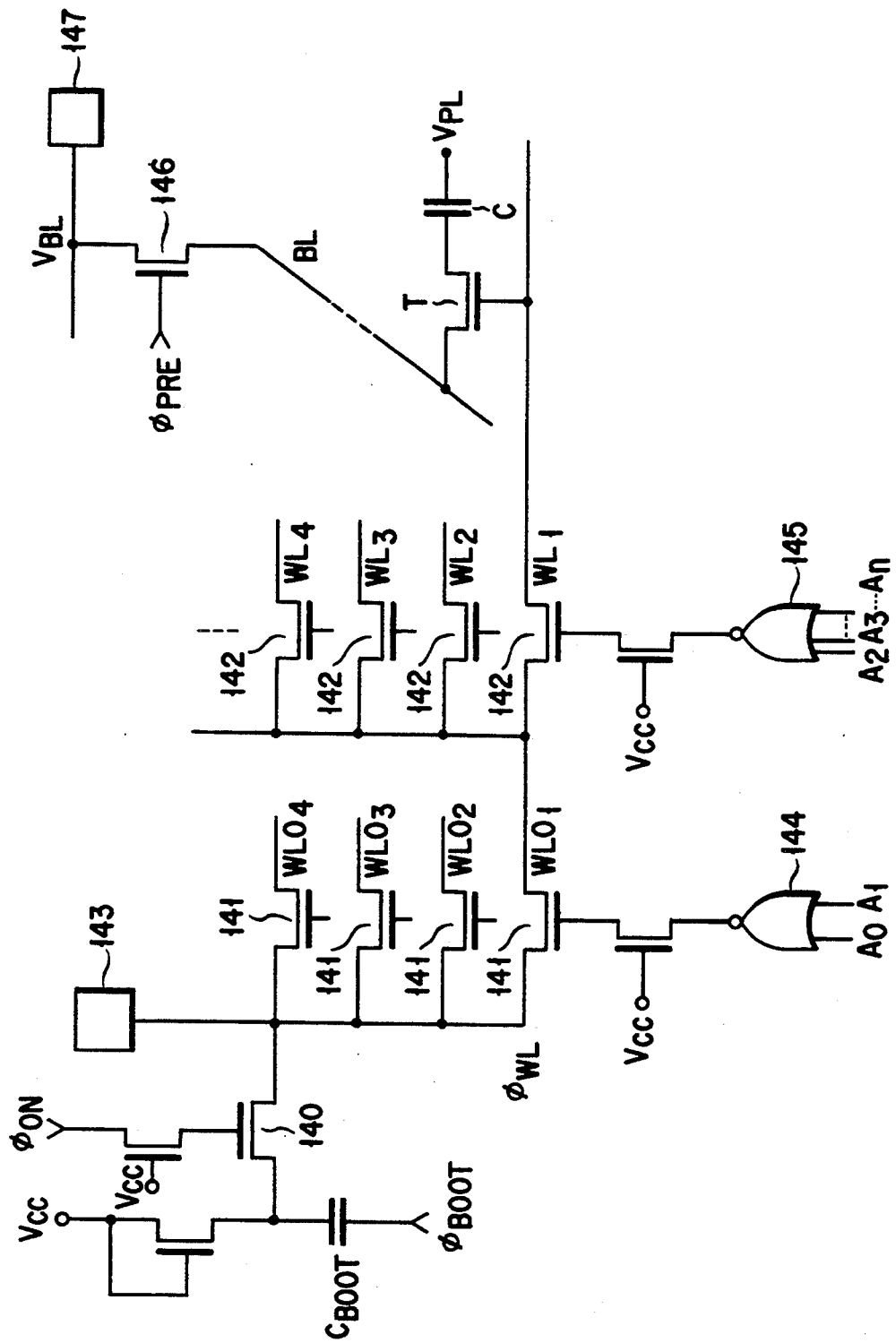
FIG. 1 is a circuit diagram showing a circuit for realizing the quick AC burn-in test mode of a conventional DRAM.
Figure 2:
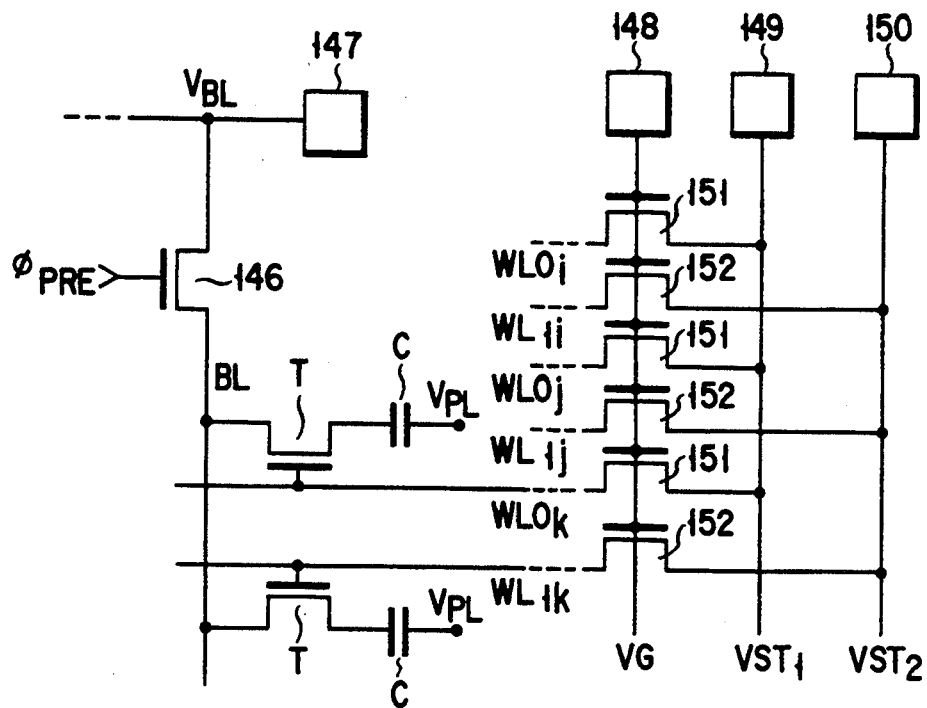
FIG. 2 is a circuit diagram showing another circuit for realizing the quick AC burn-in test mode of a conventional DRAM.
Figure 3:
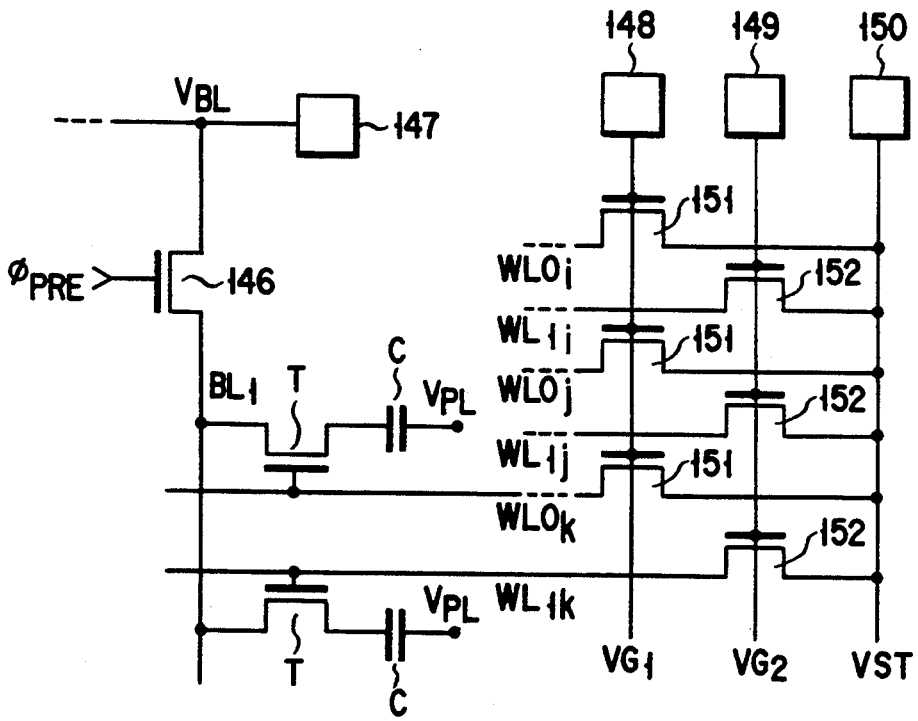
FIG. 3 is a circuit diagram showing still another circuit for realizing the quick AC burn-in test mode of a conventional DRAM.

The embodiments of the present invention will be described below with reference to the accompanying drawings.

FIG. 4 shows part of a DRAM incorporating a quick AC/DC burn-in test mode according to the first embodiment of the present invention.

The DRAM shown in FIG. 4 will be briefly described first. In addition to a normal access mode, a normal burn-in mode, and a standardized multiple-bit parallel test mode, a DRAM circuit 10 has a quick AC/DC burn-in test mode in which AC/DC voltage stresses are simultaneously applied to word lines larger in number than those selected in a normal operation. The DRAM circuit 10 comprises: a memory cell array 1 having a plurality of dynamic memory cells arranged in the form of a matrix; word lines WL, each connected to memory cells in the same row; bit lines BL, each connected to memory cells in the same column; external terminals 2 (power supply terminal 2a to which a supply voltage is externally input, and input terminals 2b for receiving an address signal and various control signals (e.g., a write enable signal $\overline{WE}$, a row address strobe signal $\overline{RAS}$, and a column address strobe signal $\overline{CAS}$)); an address buffer circuit 3 for amplifying an external address signal input through some of the external terminals 2; a refresh address counter 4 for generating a refresh address signal for refreshing the memory cells; an address switching circuit 5 for selecting either an output signal from the refresh address counter 4 or a row address signal output from the address buffer circuit 3; a row decoder circuit (word line selecting circuit) 6 having a word line selecting function for selecting an arbitrary row in accordance with an internal row address signal output from the address switching circuit 5; a word line driving voltage source 7; a word line driving circuit 8 having at least one word line driving MOS transistor (a PMOS transistor in this embodiment) connected between the word line driving voltage source 7 and the word lines WL and designed to drive the word lines WL in accordance with an output signal from the row decoder circuit 6; a bit line transfer gate TG which is connected between the input nodes of a sense amplifier SA and the bit lines BL and is ON/OFF-controlled by a control signal $\phi T$; the sense amplifier SA for detecting information read out from the memory cells to the bit lines BL; a column decoder circuit 9; a column selecting circuit CS; a bit line precharging/equalizing circuit 11 which is connected to the bit lines BL and is ON/OFF-controlled by a bit line equalizing signal EQL; and a bit line precharging potential (VBL) generating circuit 12 for applying a potential VBL to the bit line precharging/equalizing circuit 11. In addition, the DRAM circuit 10 includes a fail-safe redundant arrangement (spare memory cells, spare word lines SWL, a spare row decoder, a word line driving circuit 13, and the like). The word line driving voltage source 7 is a booster circuit for generating a word line driving voltage VPP by boosting a supply voltage VCC, applied from the outside of the semiconductor chip, on the chip, and applying the word line driving voltage VPP as power to the word line driving circuit 8. In this case, although a charge pump type booster circuit may be used as the word line driving voltage source 7, a booster circuit having a large current driving capacity (constituted by, e.g., a ring oscillation circuit and a rectifying circuit) is preferably used. The DRAM circuit 10 may have a switching circuit (not shown) for selecting an output from the above-mentioned booster circuit in a normal operation, and selecting an externally applied word line driving voltage and applying the selected voltage as a word line driving voltage in a voltage stress test. However, this embodiment includes a VPP-VCC short circuit 14 for connecting the output node of the word line driving voltage source 7 to the power supply terminal 2a by short-circuiting so as to externally apply a word line driving voltage in a voltage stress test.

A burn-in test mode signal generating circuit 20 generates a burn-in test mode signal BITAC/BITDC on the basis of a predetermined signal input through some of the external terminals 2 used in a normal operation of the DRAM circuit 10. In the embodiment, the burn-in test mode signal BITAC/BITDC is set at high ("H") level in an active state, and is set at low ("L") level in an inactive state. For example, in a WCBR cycle to be described later (the $\overline{WE}$ and $\overline{CAS}$ signal inputs are activated before the $\overline{RAS}$ signal input), the burn-in test mode signal generating circuit 20 loads a row address signal input at the time when the $\overline{RAS}$ signal is activated. If the row address signal input coincides with a predetermined address combination, the burn-in test mode signal generating circuit 20 sets the signal BITAC/BITDC at "H" level. As described above, when the burn-in test mode is set in accordance with a WCBR cycle, upper-level compatibility with respect to the multiple-bit parallel test mode as one of the existing function test modes can be ensured as follows. When a WCBR cycle is performed upon setting a normal supply voltage (e.g., 3 V) for a normal operation, the conventional multiple-bit parallel test mode is set. When a WCBR cycle is performed upon setting a high supply voltage (e.g., 6 V) falling outside a normal operation range, the signal BITAC/BITDC is set at "H" level. Assume that there are a plurality of types of burn-in test modes. In this case, the following mode setting scheme may be employed. when the $\overline{RAS}$ signal input is activated in a WCBR cycle upon setting a high supply voltage falling outside a normal operation range, some bits of the address signal constitute a predetermined combination (in the embodiment, both bits A0R and A1R are set "L" level), thereby setting the quick AC/DC burn-in test mode. Note that if the DRAM circuit 10 incorporates only the quick AC/DC burn-in test mode, the above-described complicated mode setting scheme need not be employed. For example, the quick AC/DC burn-in test mode may be set when only a WCBR cycle is performed. Alternatively, a specific external terminal is set at a voltage other than a normal applied voltage (e.g., a voltage higher than a normal supply voltage: a super voltage), and the AC/DC burn-in test mode is set by detecting this voltage.

A burn-in test mode control circuit 21 receives a burn-in test mode signal BITAC from the burn-in test mode signal generating circuit 20, and fixes only the upper bits of each of complementary output signals from the refresh address counter 4 of the DRAM circuit 10 at the same level, thereby setting an AC stress test mode (e.g., a quick AC burn-in test mode) in which the duty ratio at which a high voltage is applied to the word lines WL of the DRAM circuit 10 is higher than that in a normal operation. In addition, the burn-in test mode control circuit 21 receives a burn-in test mode signal BITDC from the burn-in test mode signal generating circuit 20, and fixes all the bits of an output signal from the refresh address counter 4 of the DRAM circuit 10 at the same level, thereby controlling the word line driving circuit 8 of the DRAM circuit 10 to simultaneously drive all the word lines (setting a quick DC burn-in test mode). The burn-in test mode control circuit 21 is preferably designed to control other circuits in proper circuit states in accordance with the AC burn-in test mode, in addition to receiving the burn-in test mode signal BITAC from the burn-in test mode signal generating circuit 20 to fix only the upper bits of each of complementary output signals from the refresh address counter 4 of the DRAM circuit 10 at the same level. More specifically, the burn-in test mode control circuit 21 preferably performs control to selectively drive the spare word lines SWL at the same duty ratio as that for the normal word lines WL, and limits the capacity of a driving transistor for the sense amplifier SA to forcibly control the control signal $\phi T$ at an active level (i.e., controlling the bit line transfer gate TG in an ON state in a voltage stress test). In addition, the burn-in test mode control circuit 21 is preferably designed to control other circuits in proper circuit states in accordance with the DC burn-in test mode, in addition to receiving the burn-in test mode BITDC from the burn-in test mode signal generating circuit 20 to fix all the bits of each of complementary output signals from the refresh address counter 4 of the DRAM circuit 10 at the same level. More specifically, the burn-in test mode control circuit 21 preferably performs control to selectively drive the spare word lines SWL, controls the control signal $\phi T$ and the bit line equalizing signal EQL at an active level (i.e., controlling the bit line transfer gate TG and the bit line precharging/equalizing circuit 11 in an ON state in a voltage stress test), controls the bit precharging voltage VBL at a low level, and performs control to inhibit the operation of the sense amplifier SA and circuits on its output side (e.g., a buffer circuit connected to the data lines).

According to the DRAM shown in FIG. 4, when the burn-in test mode signal BITAC is generated by the burn-in test mode signal generating circuit 20 on the basis of a predetermined signal input through some of the external terminals 2, of the DRAM circuit 10, used in a normal operation, only the upper bits of each output signal from the refresh address counter 4 of the DRAM circuit 10 are fixed at the same level, thereby setting the quick AC burn-in test mode. In this case, since the lower bits of each output signal from the refresh address counter 4 change in accordance with a counter operation, the AC voltage stress test mode can be set, in which the duty ratio at which a high voltage is applied to the word lines WL of the DRAM circuit 10 is higher than that in a normal operation, thereby allowing a quick screening test of a decrease in the breakdown voltage of the insulating film of the bit line transfer gate TG of each memory cell. In addition, when the burn-in test mode signal BITDC is generated on the basis of a predetermined signal input through some of the external terminals 2, of the DRAM circuit 10, used in a normal operation, all the bits of each of complementary output signals from the refresh address counter 4 of the DRAM circuit 10 are fixed at the same level, thereby setting the quick DC burn-in test mode.

No specific pads, therefore, are required to set the quick AC/DC burn-in test mode, and the number of circuits other than the circuits required for the normal operation mode can be minimized, thus reducing an increase in chip area. In addition, since no specific pads are required to set the quick AC/DC burn-in test mode, the quick burn-in test mode can be set in a wafer state or after packaging. For this reason, in a quick AC/DC burn-in test in a wafer state, test units (e.g., a probe card) used for a normal function test can be used. In a quick AC/DC burn-in test after packaging, a general memory tester can be used.

Portions associated with the present invention shown in FIG. 4 will be described next with reference to FIGS. 5 to 17. Note that the suffix "n" of each reference numeral in FIGS. 5 to 17 indicates that each portion denoted by each reference numeral corresponds to one of cell blocks constituting the memory cell array 1.

Figure 5:
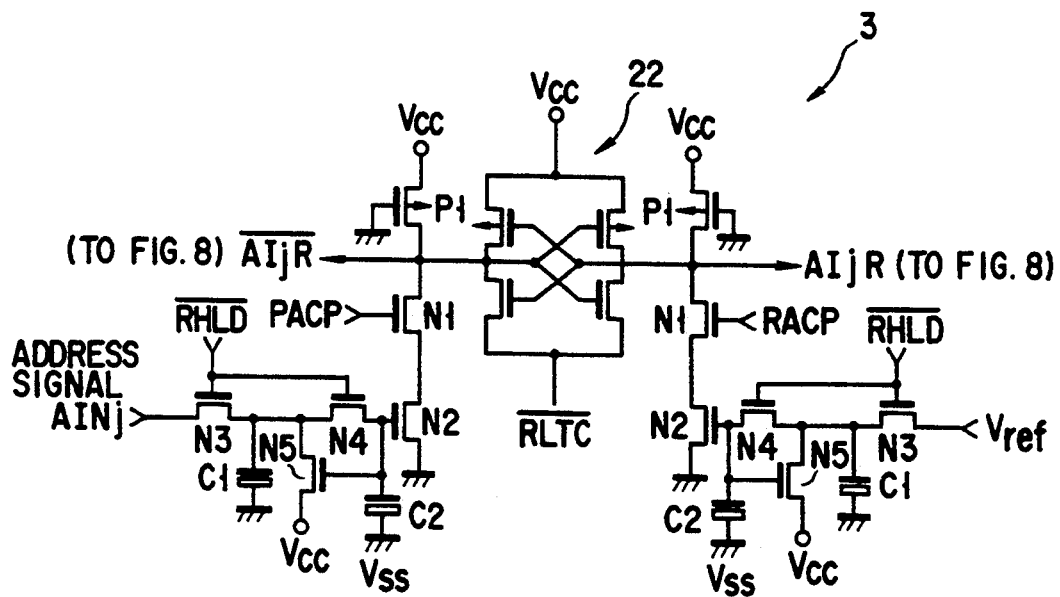
FIG. 5 is a circuit diagram showing part of a row address buffer circuit in FIG. 4.

FIG. 5 is a circuit diagram showing part of a row address buffer (corresponding to one bit) of the address buffer circuit 3 in FIG. 4. Referring to FIG. 5, reference symbol VCC denotes a supply potential; VSS, a ground potential; P1, a p-channel MOS transistor; N1 to N5, n-channel MOS transistors; and C1 and C2, MOS capacitors through which the drains and sources of the n-channel MOS transistors are commonly connected to the VSS node. Reference numeral 22 denotes a differential latch circuit. Reference symbol $\overline{RLTC}$, a latch control signal; AINj (j=0 to 10), an externally input address signal; Vref, a reference potential; RACP and $\overline{RHLD}$, gate control signals; and AIjR and $\overline{AIjR}$, complementary row address buffer output signals.

Figure 6:
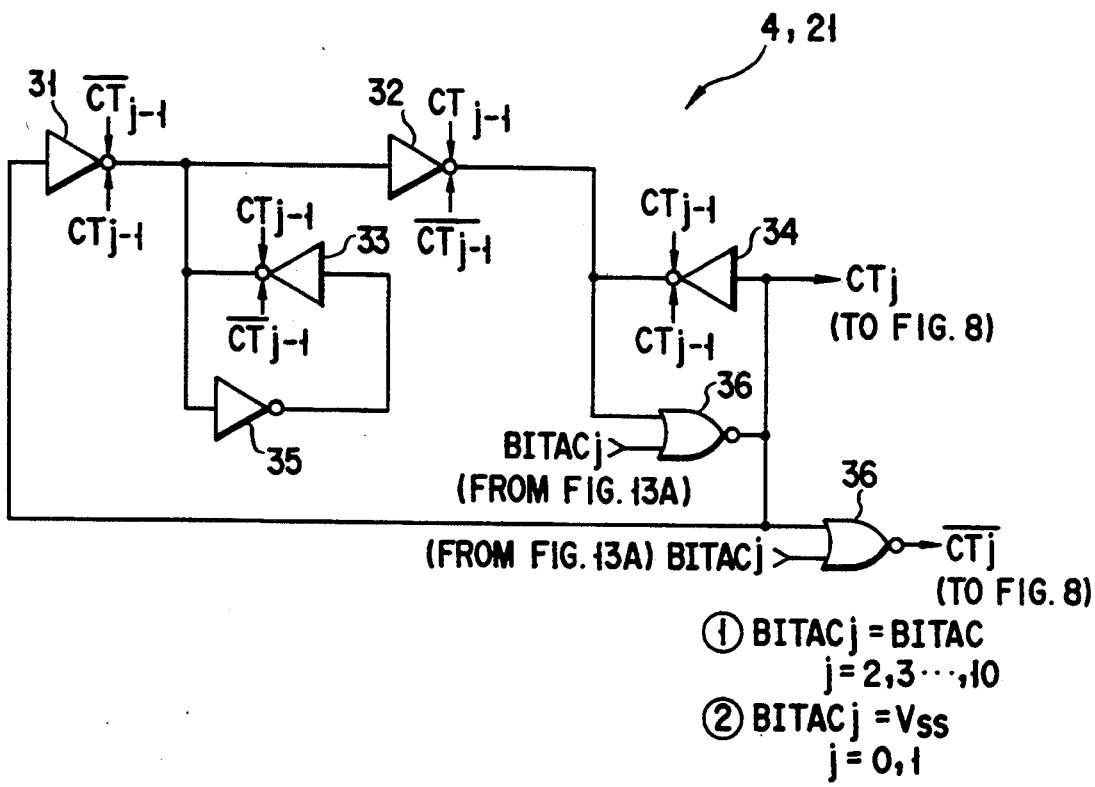
FIG. 6 is a circuit diagram showing a one-stage portion of a refresh address counter and part of an AC burn-in test mode control circuit in FIG. 4.

FIGS. 6 and 7 are circuit diagrams respectively showing part (corresponding to one stage) of the refresh address counter 4 and the burn-in test mode control circuit 21 in FIG. 4. Referring to FIG. 6, reference numerals 31 to 34 denote clocked inverters; and 35, an inverter. For example, two-input NOR gates 36 as part of the burn-in test mode control circuit 21 are inserted between the complementary output terminals of the respective stages of the address counter. A signal BITACj (j=0 to 10) is input to one input terminal of each of the NOR gates 36. This signal BITACj is set as follows. Assume that in the DRAM circuit 10 in FIG. 4, the shared sense amplifier scheme, in which the sense amplifier SA is used according to the time division scheme between adjacent memory cell blocks, is not employed, or the transfer gate control signal φT is forcibly set at "H" level in the AC burn-in test mode, as will be described later. In this case, the signal BITAC signal is input to one input terminal of each of the NOR gates 36 inserted between output terminals, of the address counter 4, which correspond to upper bits, e.g., 9 bits (j=2 to 10 bits). The potential VSS ("L" level) is input to one input terminal of each of the NOR gates 36 inserted between output terminals, of the address counter 4, which correspond to the remaining lower 2 bits (j=0 and 1 bits) (i.e., the NOR gates 36 serve as inverters). In contrast to this, assume that in the DRAM circuit 10 in FIG. 4, the shared sense amplifier scheme is employed to use the 8th bit of the address counter output so as to perform address selection of cell blocks on both sides of the sense amplifier SA, and that the transfer gate control signal φT is not forcibly set at "H" level in the AC burn-in test mode, as will be described later. In this case, the signal BITAC is input to one input terminal of each of the NOR gates 36 inserted between output terminals, of the address counter 4, which correspond to upper bits, e.g., upper 8 bits (j=3 to 10 bits). The potential VSS ("L" level) is input to one input terminal of each of the NOR gates 36 inserted between output terminals, of the address counter 4, which correspond to the remaining lower 3 bits (j=0, 1, and 2 bits) (i.e., the NOR gates 36 serve as inverters). j=2 corresponds to addresses for selecting cell blocks on both sides of the shared sense amplifier. Note that reference symbols CTj and $\overline{CTj}$ (j=0 to 10) denote complementary output signals from the address counter 4. Referring to FIG. 7, the signal BITDC is input to one input terminal of each of the NOR gates 36. Reference symbols CTj and $\overline{CTj}$ denote complementary output signals from the address counter 4.

FIG. 8 is a circuit diagram showing part (corresponding to one bit) of the address switching circuit 5 in FIG. 4. Referring to FIG. 8, reference numeral 41 denotes an address switching NMOS transistor; and 42, an inverter for a latch circuit. Reference symbol $\overline{RTRS}$ denotes a switching signal for selecting a row address buffer output; CT, a switching signal for selecting an address counter output; and AjR and $\overline{AjR}$, selection outputs (internal row address signals).

The circuits shown in FIGS. 5 to 8 are logically designed to realize operations such as those indicated by the timing charts shown in FIGS. 9, 10, 11, and 12 in accordance with the normal operation mode, refresh operation mode, quick AC burn-in test mode, and quick DC burn-in test mode of the DRAM. The state of the row address buffer circuit 3 is determined by signals RACP, $\overline{RHLD}$, $\overline{RLTC}$, $\overline{RTRS}$, AIjR, and $\overline{AIjR}$.

Figure 9:
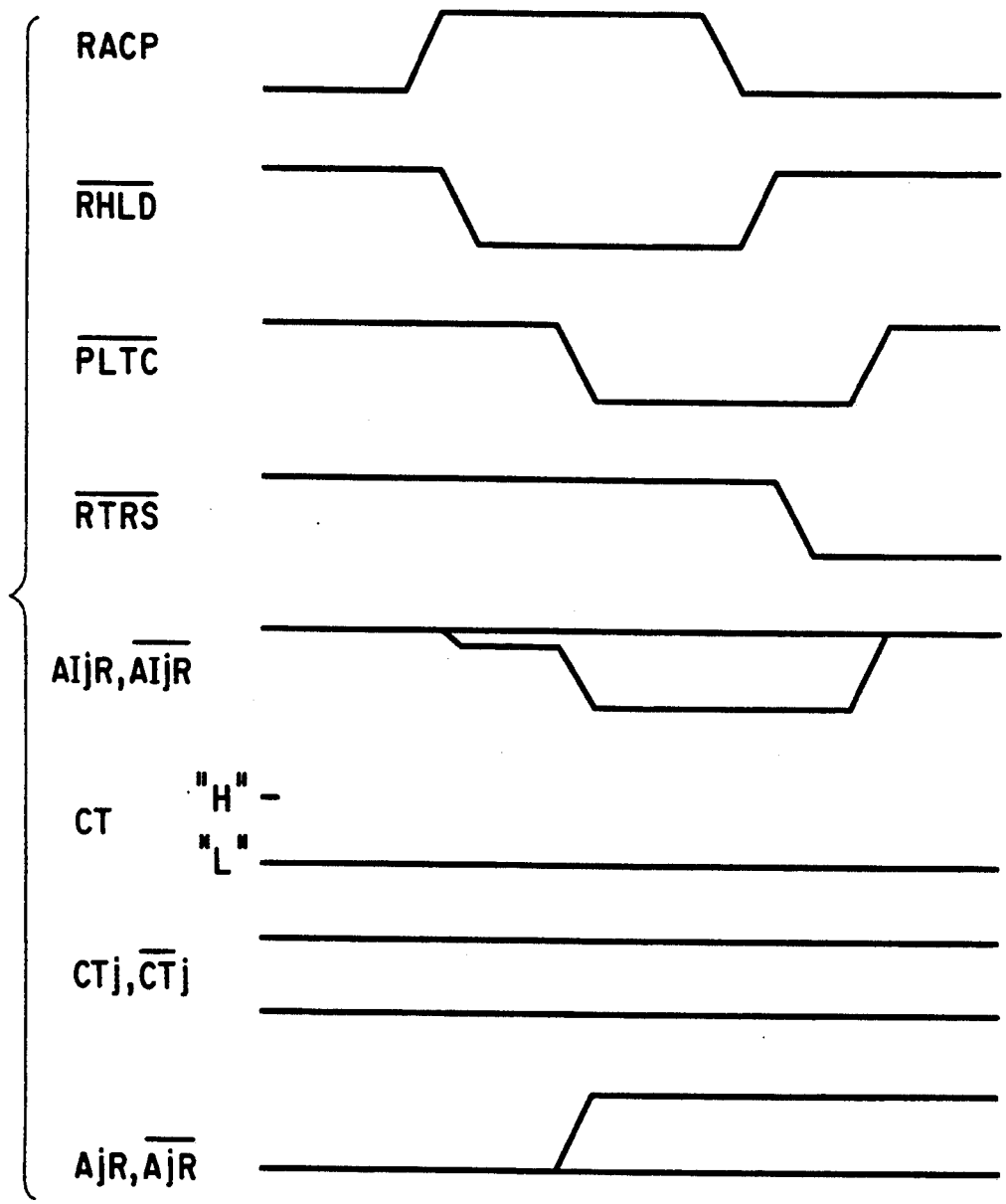
FIG. 9 is a timing chart showing operations of the circuits in FIGS. 5 to 8 in the normal operation mode.

In the normal operation mode shown in FIG. 9, the signal BITAC/BITDC is at "L" level, and the DRAM circuit 10 operates in the same manner as the conventional DRAM. More specifically, in loading a column address signal by activating the signal $\overline{CAS}$ signal after loading a row address signal by activating the signal $\overline{RAS}$, the signal CT is kept at "L" level, and the signal $\overline{RTRS}$ is kept at "H" level. With this operation, the row address buffer output signals AIjR and $\overline{AIjR}$ are selected and loaded as the internal row address signals AjR and $\overline{AjR}$.

Figure 10:
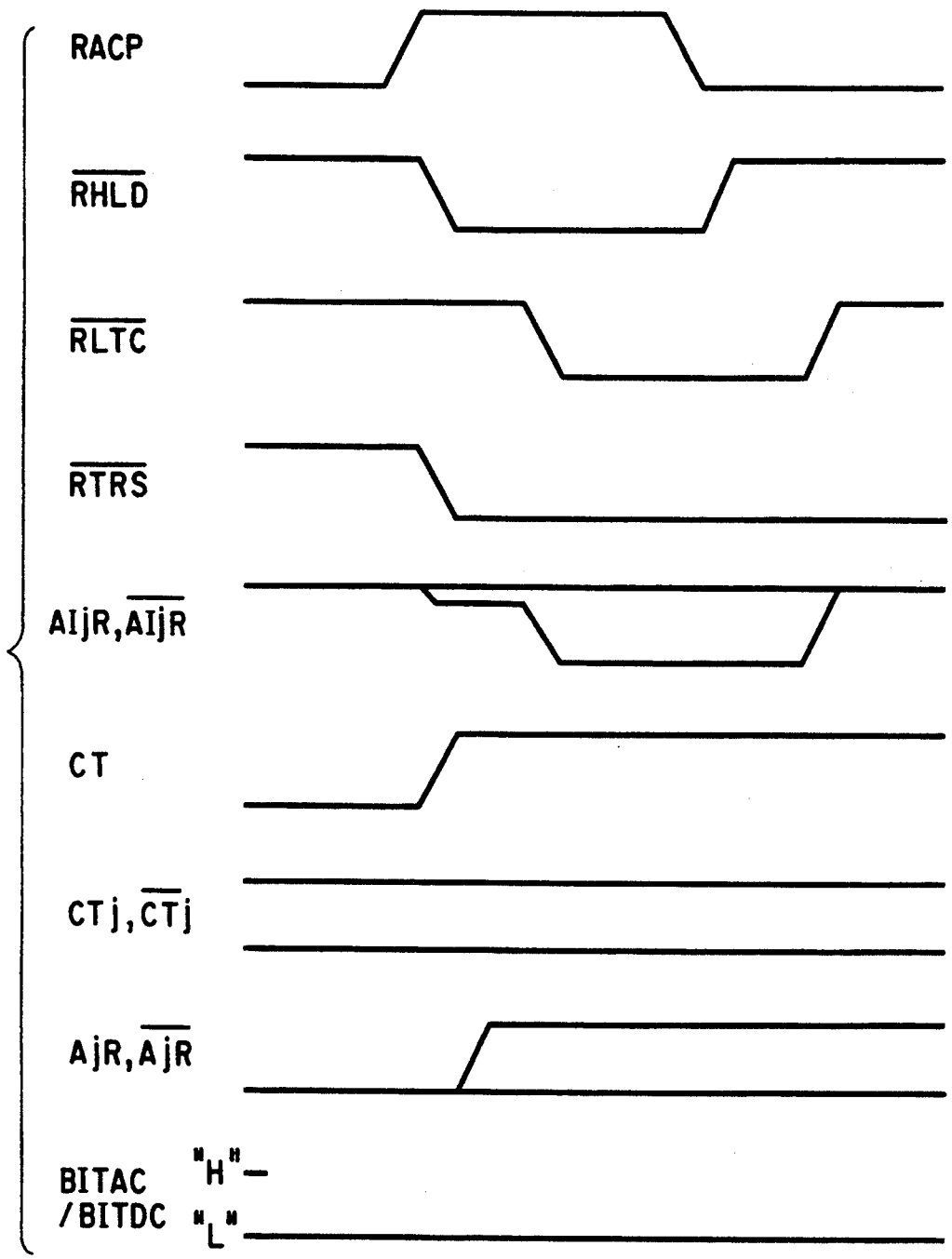
FIG. 10 is a timing chart showing operations of the circuits in FIGS. 5 to 8 in the refresh operation mode.

FIG. 10 shows an automatic refresh operation based on the execution of a CBR cycle (i.e., activating the signal $\overline{CAS}$ earlier than the signal $\overline{RAS}$). In this refresh operation, the signal $\overline{RTRS}$ is immediately set at "L" level to inhibit selection of the row address buffer output signals AIjR and $\overline{AIjR}$. At the same time, the signal CT is activated to select the output signals CTj and $\overline{CTj}$ stored in the address counter 4 at this time so as to load them as internal row address signals RABj and $\overline{RABj}$, thus refreshing memory cells selected by the resulting word line selection signal.

Figure 11:
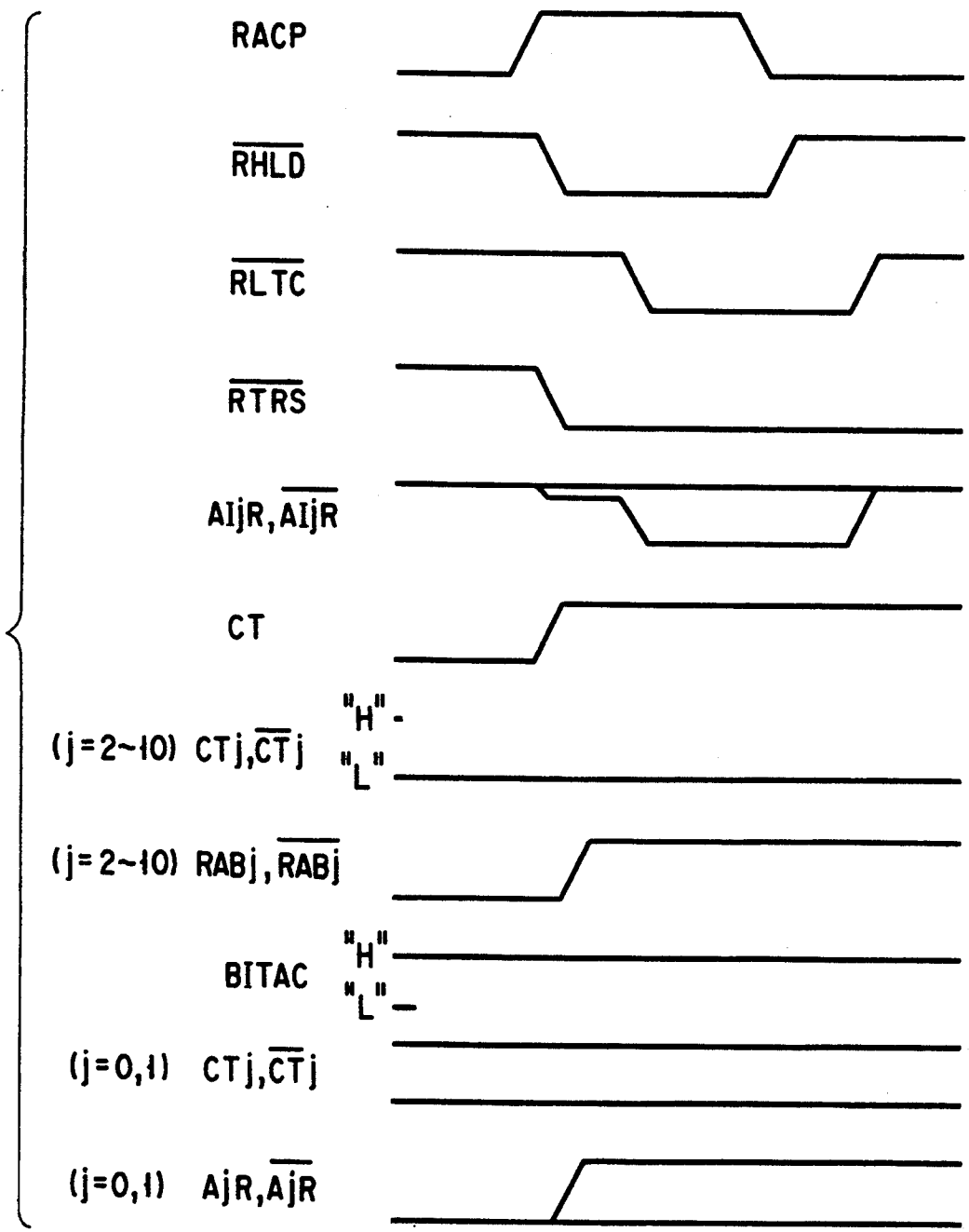
FIG. 11 is a timing chart showing operations of the circuits in FIGS. 5, 6, and 8 in the quick AC burn-in test mode.
Figure 12:
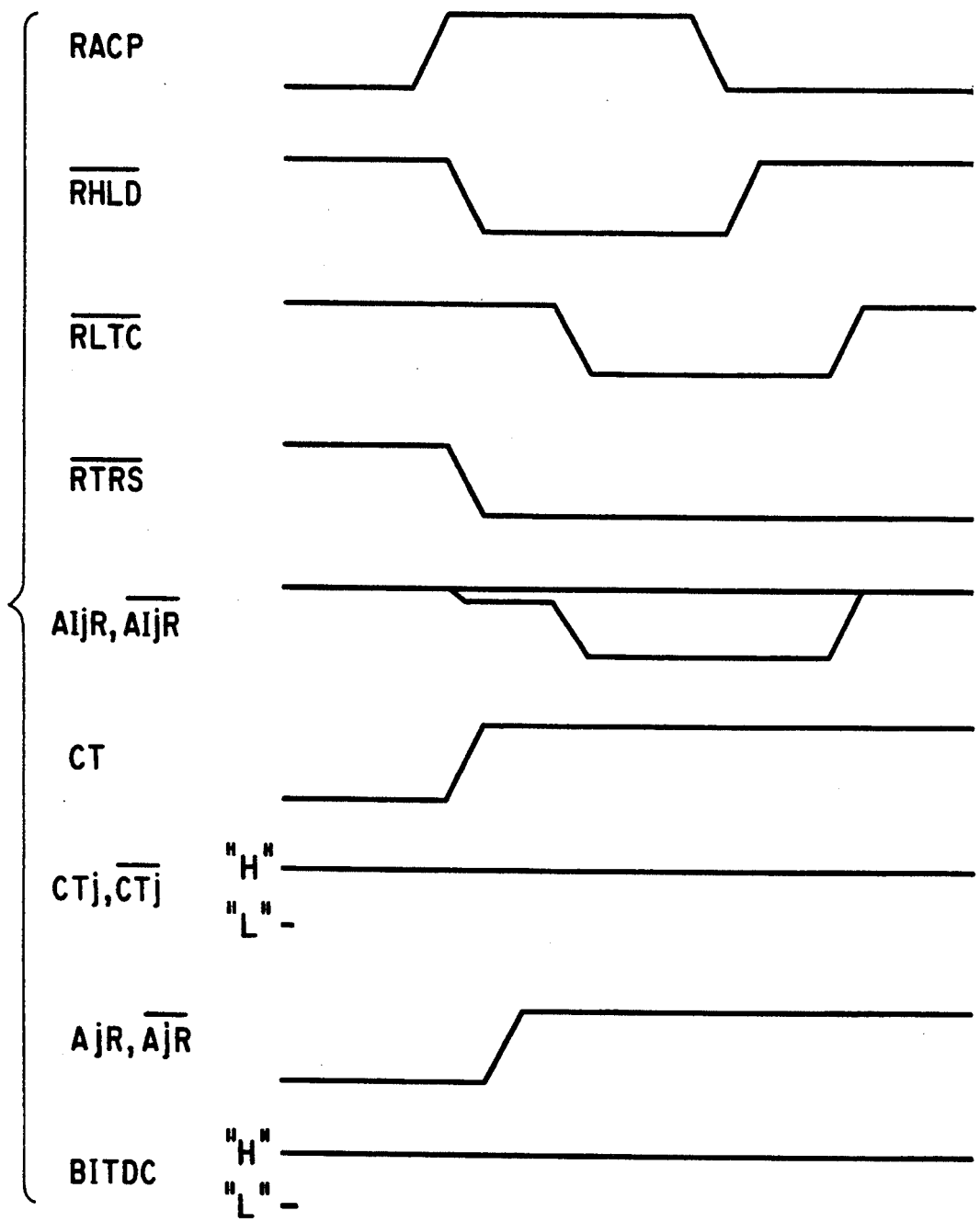
FIG. 12 is a timing chart showing operations of the circuits in FIGS. 5, 7, and 8 in the quick DC burn-in test mode.

In the AC burn-in test mode shown in FIG. 11, the signal BITAC is set at "H" level, and the upper 9 bits (j=2 to 10) of each of the output signals CTj and $\overline{CTj}$ from the refresh address counter 4 are fixed at "L" level. The lower 2 bits (j=0 and 1) of each of the output signals CTj and $\overline{CTj}$ from the address counter 4 change in accordance with a counter operation. When a CBR cycle is executed at this time, the upper 9 bits (j=2 to 10) of each of the internal row address signals AjR and $\overline{AjR}$ are fixed at "H" level, and the lower 2 bits (j=0 and 1) of each of the internal row address signals AjR and $\overline{AjR}$ change in accordance with a counter operation. As a result, only some output nodes of the word line driving circuit 8 are selected, and only some of the word lines WL are selected and set at "H" level. In the DC burn-in test mode shown in FIG. 12, the signal BITDC is set at "H" level, and all the bits of each of the output signals CTj and $\overline{CTj}$ from the refresh address counter 4 are fixed at "L" level. When a CBR cycle executed at this time, all the bits of each of the internal row address signals AjR and $\overline{AjR}$ are fixed at "H" level. That is, all the bits of the word line selection signal are fixed at the "H" level. Consequently, all the output nodes of the word line driving circuit 8 are selected, and all the word lines WL are selected and set at "H" level.

Figure 13A:
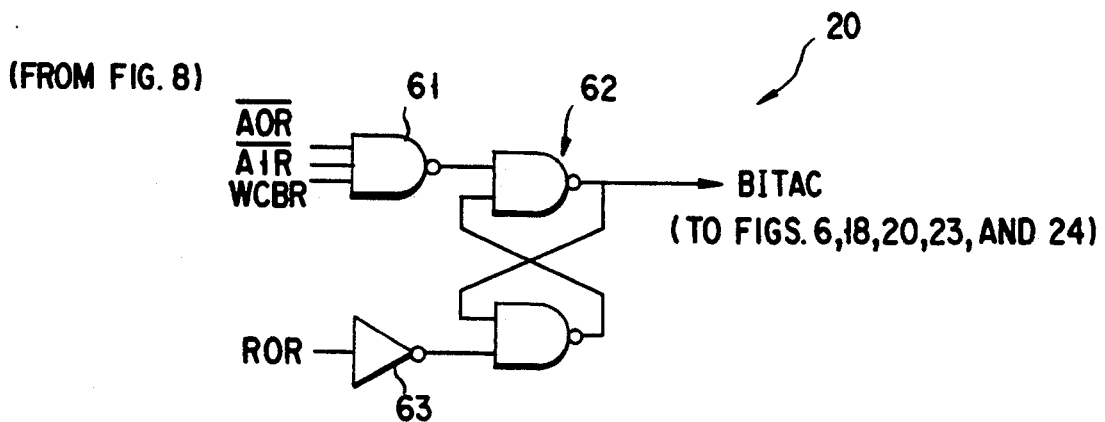
FIGS. 13A and 13B are a circuit diagram of an AC burn-in test mode signal generating circuit and a timing chart thereof in FIG. 4, respectively.
Figure 14A:
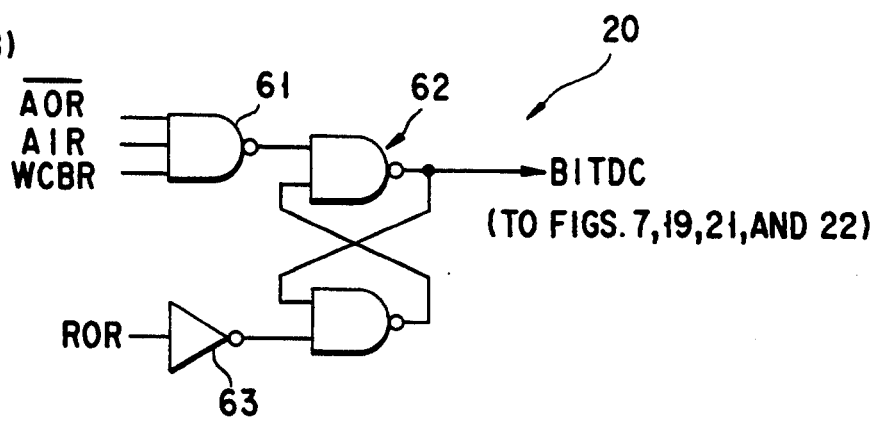
FIGS. 14A and 14B are a circuit diagram of a DC burn-in test mode signal generating circuit and a timing chart thereof in FIG. 4, respectively.
Figure 14B:
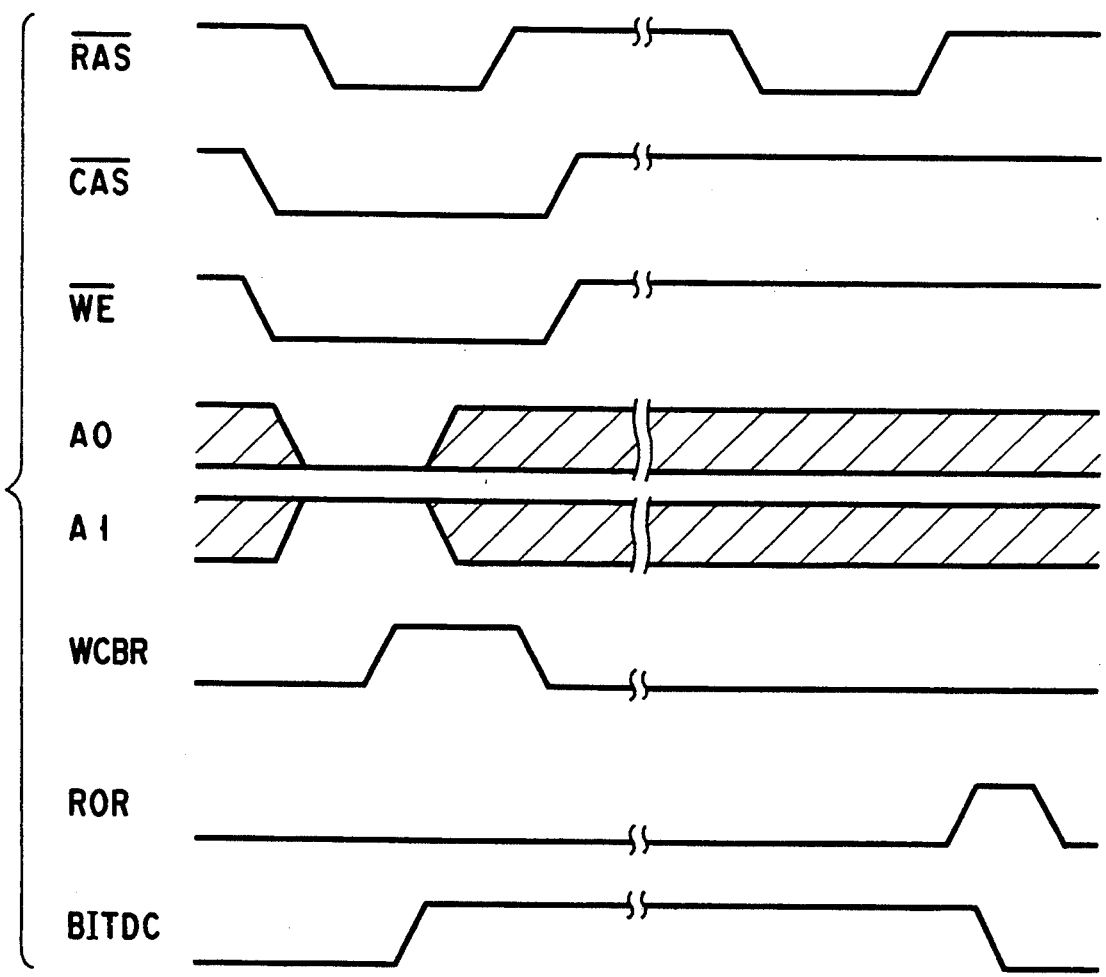

FIGS. 13A and 14A are circuit diagrams exemplifying the burn-in test mode signal generating circuit 20. Referring to FIG. 13A, reference symbol WCBR denotes a signal generated when a clock for a WCBR cycle is input; $\overline{A0R}$ and $\overline{A1R}$, bits of an internal row address signal obtained when the signal input $\overline{RAS}$ is activated; and ROR, a signal generated when a clock for an ROR cycle (an RAS only refresh cycle for temporarily activating only the signal $\overline{RAS}$) is input. Reference numeral 61 denotes a three-input NAND gate; 62, a flip-flop circuit; and 63, an inverter. In FIG. 14A, the bit A1R of an internal row address signal is input, instead of the bit $\overline{A1R}$ in FIG. 13A, to generate the signal BITDC.

Figure 13B:
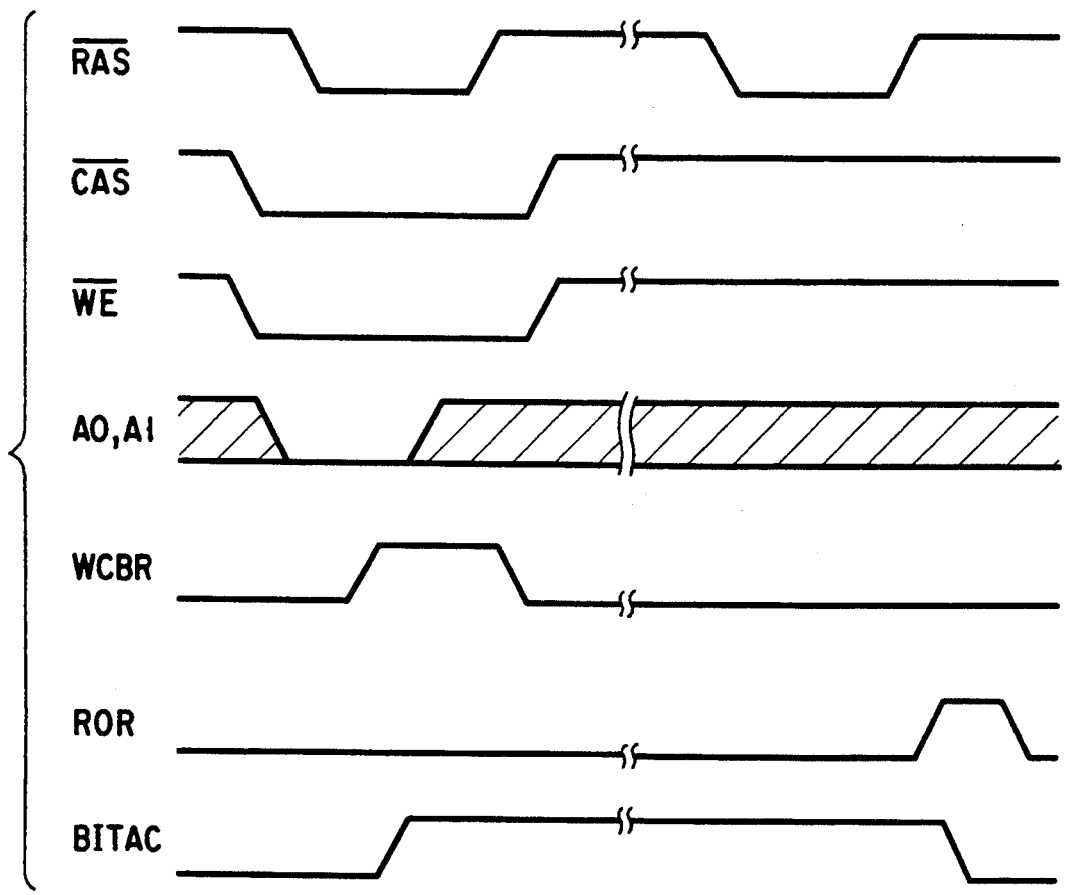

The circuit shown in FIG. 13A is logically designed to realize an operation such as the one indicated by the timing chart shown in FIG. 13B. More specifically, if a WCBR cycle is performed when both the bits A0R and A1R of an address signal are set at "L" level, the signal BITAC is set at "H" level. When an ROR cycle is executed upon completion of the AC burn-in test mode, the signal BITAC goes to "L" level. The circuit shown in FIG. 14A is logically designed to realize an operation such as the one indicated by the timing chart shown in FIG. 14B. More specifically, if a WCBR cycle is performed when bits A0 and A1 of an address signal are set at "L" level and "H" level, respectively, the signal BITDC is set at "H" level. When an ROR cycle is executed upon completion of the DC burn-in test mode, the signal BITDC goes to "L" level.

Figure 15:
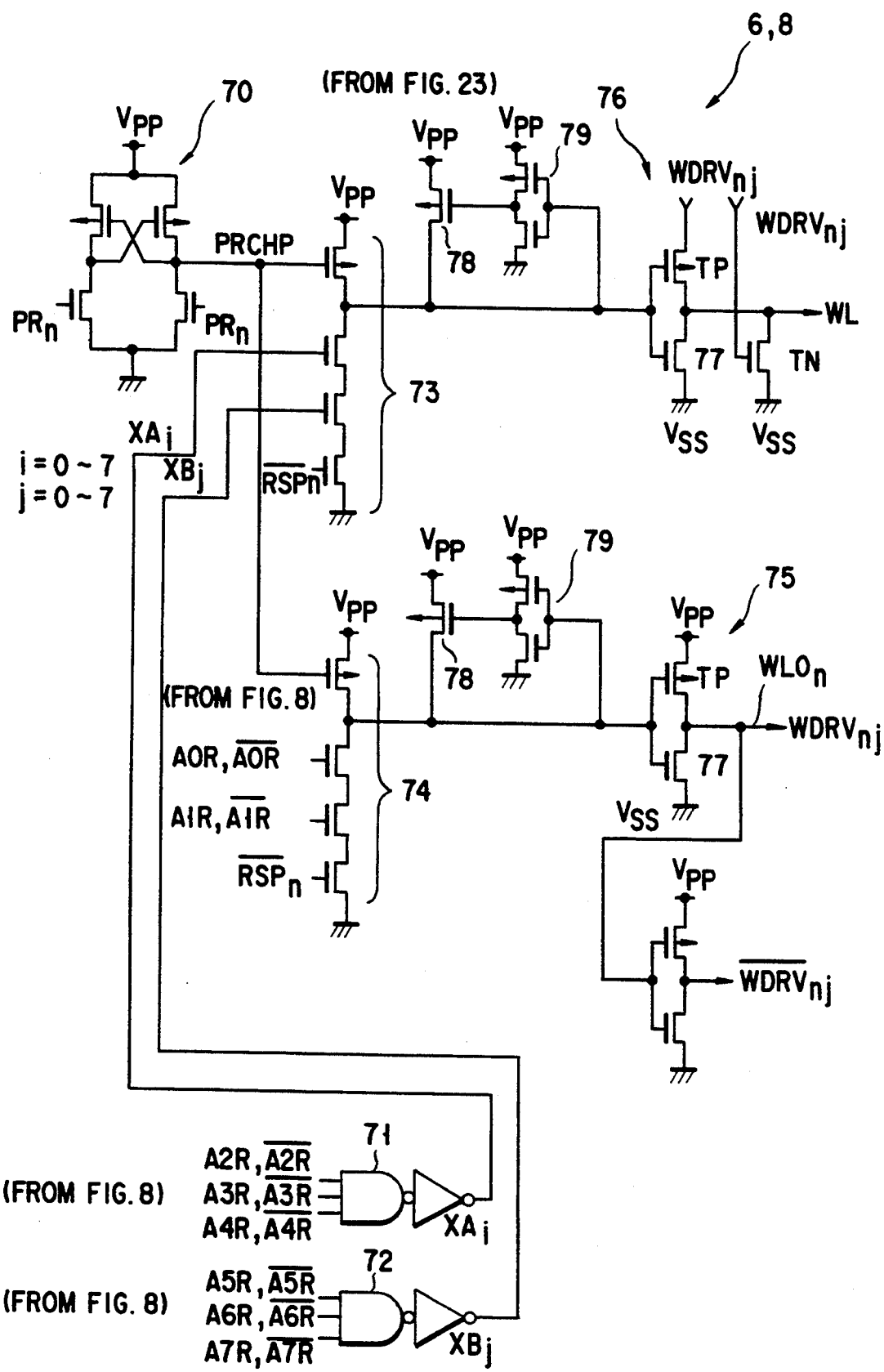
FIG. 15 is a circuit diagram showing part of a row decoder circuit and a word line driving circuit in FIG. 4.

FIG. 15 is a circuit diagram showing part of the row decoder circuit 6 and the word line driving circuit 8 in FIG. 4. Referring to FIG. 15, reference symbols PRn and $\overline{PRn}$ denote precharging signals for a cell block n. Reference numeral 70 denotes a differential circuit. Reference symbol PRCHP denotes a precharging signal output from the differential circuit 70. A NAND circuit 71 outputs a signal XAi (i=0 to 7) by decoding a signal obtained by combining bits A2R, $\overline{A2R}$, A3R, $\overline{A3R}$, A4R, and $\overline{A4R}$ of internal row address signals. A NAND circuit 72 outputs a signal XSi (i=0 to 7) by decoding a signal obtained by combining bits A5R, $\overline{A5R}$, A6R, $\overline{A6R}$, A7R, and $\overline{A7R}$ of internal row address signals. A NAND circuit 73 has a precharging PMOS transistor Load having a gate to which the signal PRCHP is input, and decodes the signal XAi, the signal XBj, and a signal $\overline{RSPn}$ (for permitting selection of the word lines WL). A NAND circuit 74 has a precharging PMOS transistor load having a gate to which the signal PRCHP is input, and decodes a signal obtained by combining the bits A0R, $\overline{A0R}$, A1R, and $\overline{A1R}$ of internal address signals, and the signal $\overline{PSPn}$. Four NAND circuits 74 are arranged for one cell block in the embodiment. A first word line driving circuit 75 is selectively driven by an output from the NAND circuit (row decoder) 74. A second word line driving circuit 76 is selectively driven by an output from the NAND circuit (row decoder) 73. Reference symbol WLOn denotes a word line (there are four word lines per cell block in the embodiment) having one end connected to a corresponding one of the output nodes of the first word line driving circuit 75, and the other end connected to a driving voltage source node of the second word line driving circuit 76; WDRVn, the voltage of the word line WLOn; $\overline{WDRVnj}$, a voltage obtained by inverting the level of the word line voltage WDRVnj; and WL, a word line having one end connected to a corresponding one of the output nodes of the second word line driving circuit 76. The first word line driving circuit 75 comprises a word line driving PMOS transistor TP connected between a driving voltage source node and the word line WLOn, an NMOS transistor 77 connected between the word line and a VSS node, a pull-up PMOS transistor 78 connected between a VCC node and a driving circuit input node, and an inverter 79 connected between the driving circuit input node and the gate of the pull-up PMOS transistor 78. The second word line driving circuit 76 comprises a word line driving PMOS transistor TP connected to a driving voltage source node and the word line WL, an NMOS transistor 77 connected between the word line and a VSS node, a pull-up PMOS transistor 78 connected to a VCC node and a driving circuit input node, an inverter 79 connected between the driving circuit input node and the gate of the pull-up PMOS transistor 78, and a noise killer NMOS transistor TN connected to one end of the word line WL and having a gate to which the word line voltage $\overline{WDRVnj}$ is input.

Figure 16:
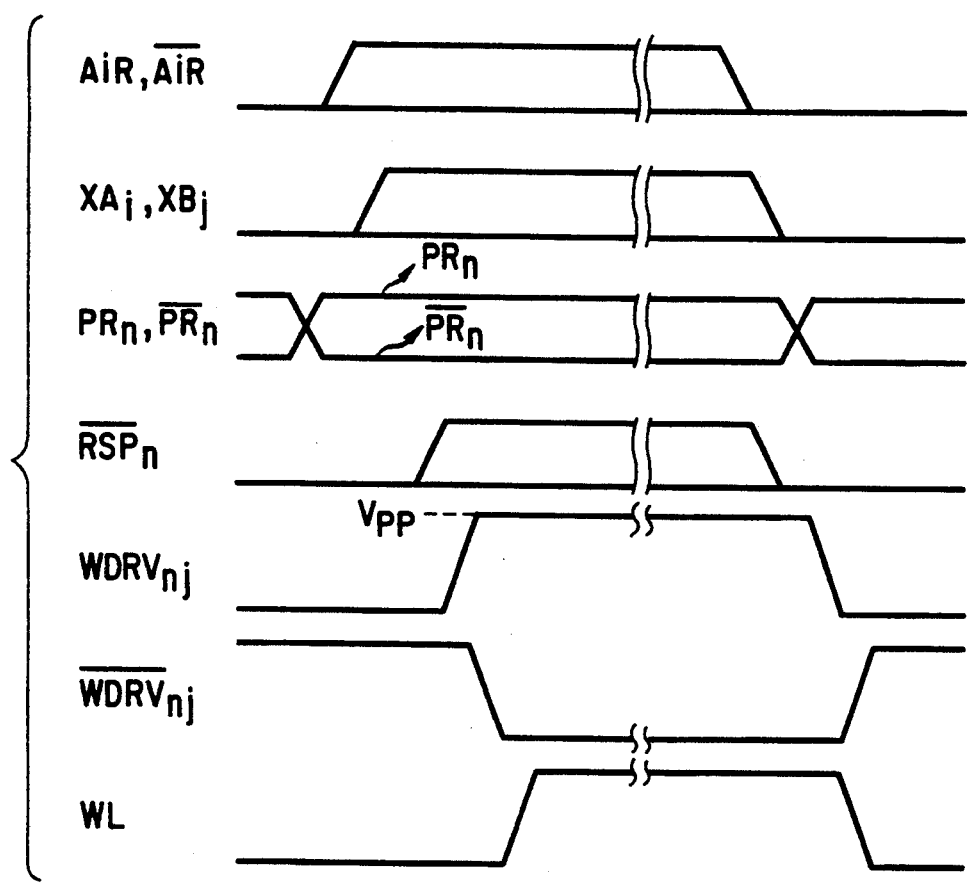
FIG. 16 is a timing chart showing an operation of the circuit in FIG. 15.

FIG. 16 is a timing chart showing an operation of the circuit shown in FIG. 15. More specifically, when the signal BITAC/BITDC is at "L" level, one word line WL is selected within activated n memory cell blocks of the memory cell array 1 either in a normal operation or in an automatic refresh operation. If, however, the signal BITAC is set at "H" level, and bits of each of the internal row address signals AjR and $\overline{AjR}$ as true and complementary signals, other than lower 2 bits (j=1 and 2) are set at "H" level, the selection capabilities of the NAND circuits 71 to 73 are disabled, so that outputs from the NAND circuits 71 to 73 are set at "L" level. With this operation, the gate potentials of all the word line driving PMOS transistors TP whose sources have received the word line voltage WDRvnj are set at "L" level. In this case, when one of the four word lines WLOi is selected and set at "H" level in accordance with the states of the address bits A0R and A1R selected by an output signal from the refresh address counter 4 in a CBR cycle, one of the word lines WL is selected by the second word line driving circuit 76. If all the n memory cell blocks are set in a selected state at this time, every fifth word line WL rises in the word line arrays of all the blocks. By repeating the CBR cycle, another set of word lines rise. If the CBR cycle is repeated four times, all the word lines WL rise. A larger number of word lines WL than that in a normal cycle simultaneously rise so that electric field stresses can be efficiently applied to the word lines WL. In addition, since every fifth word line WL rises, a high electric field is applied between adjacent word lines WL. For this reason, a larger number of failure modes can be screened than in a case wherein voltage stresses are applied to all the word lines WL in a DC manner. In the AC burn-in test mode, if the logical arrangement is modified to change only the lower 3 bits of each address counter output, every ninth word line WL rises in the word line arrays of all the blocks. If the logical arrangement is modified to change only the least significant bit of each address counter output, every second word line WL rises in the word line arrays of all the blocks. On the other hand, if the signal BITDC is set at "H" level, and both the internal row address signals AiR and $\overline{AjR}$ as true and complementary signals are set at "H" level, the selection capabilities of the NAND circuits 71, 72, 73, and 74 are disabled, and outputs from all the NAND circuits 71 to 74 are set at "L" level. As a result, all the word lines WL rise. At this time, if all the n memory cell block are also set in a selected state, all the word lines WL of all the blocks rise.

Figure 17:
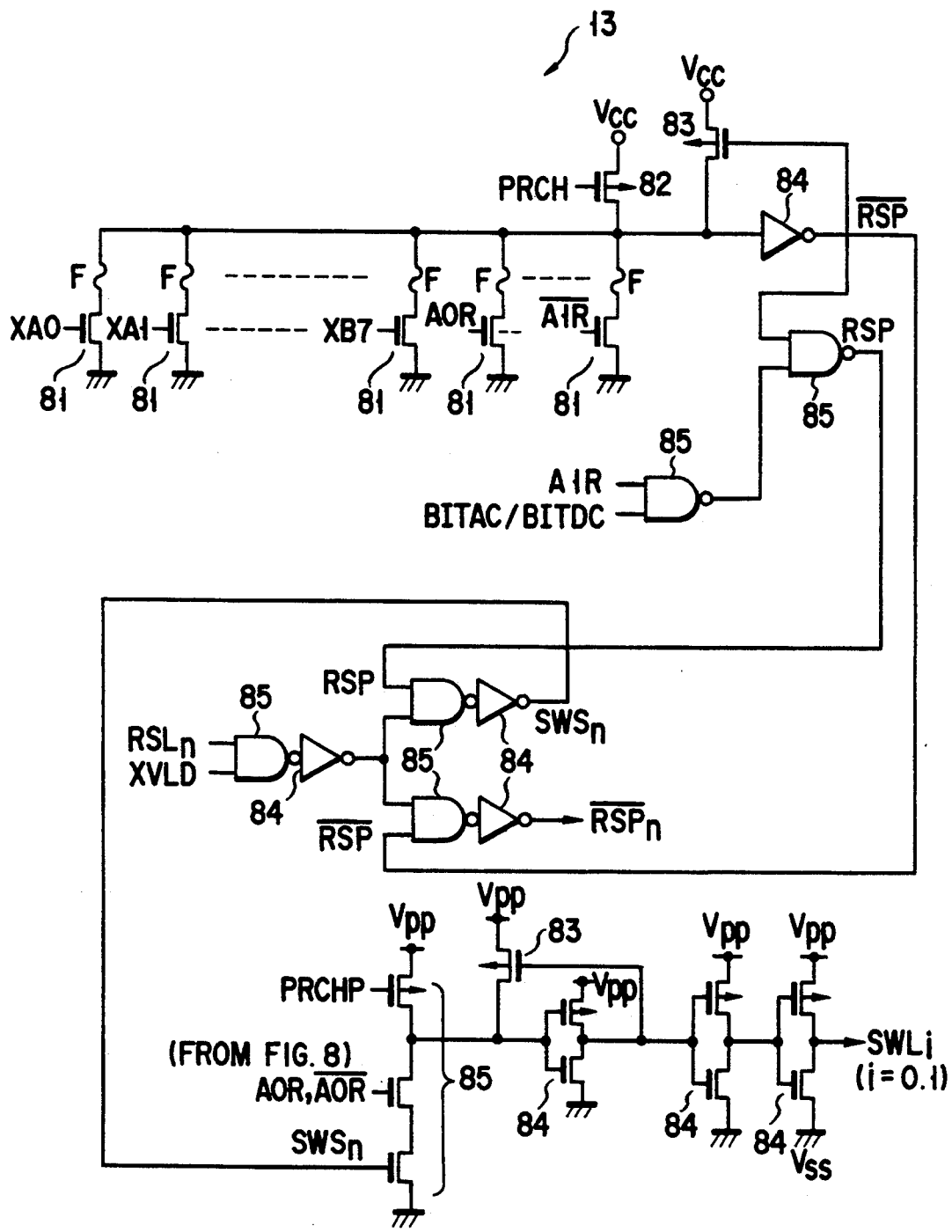
FIG. 17 is a circuit diagram showing a spare row decoder/word line driving circuit in FIG. 4.

FIG. 17 is a circuit diagram exemplifying the spare row decoder/word line driving circuit 13 in FIG. 4. Referring to FIG. 17, reference numeral 81 denotes a NOR input NMOS transistor. An address signal to be decoded is input to the gate of each NMOS transistor 81. The source of each transistor 81 is grounded. The drains of the respective transistors 81 are connected together through fuse elements F consisting of, e.g., polysilicon. The fuses F are disconnected in accordance with an address to be decoded. Reference numeral 82 denotes a precharging PMOS transistor 82; 83, a pull-up PMOS transistor; 84, an inverter; and 85, a NAND gate.

The circuit shown in FIG. 17 is logically designed to realize the following operation. In a normal operation (the signal BITAC/BITDC is at "L" level), if only an address signal input to the gate of the NOR input NMOS transistor 81 connected to the disconnected fuse element F is at "H" level, a signal $\overline{RSP}$ is set at "L" level, and a signal RSP is set at "H" level. When a sync signal XVLD goes from "L" level to "H" level in a block selected by a block selection signal RSLn, the signal $\overline{RSP}$ is kept at "L" level, and a signal SWSn goes from "L" level to "H" level. As a result, a spare word line SWLi (i=0 and 1) is selected in accordance with the logic level of the address signal bit A0R or $\overline{A0R}$. If an arbitrary NOR input address signal is at "H" level while no fuse element F is disconnected, or an address signal input to the gate of the NOR input NMOS transistor 81 other than the NOR input transistor connected to the disconnected fuse element F is set at "H" level, the signal $\overline{RSP}$ is set at "H" level, and the signal RSP signal is set at "L" level. As a result, both the signals XVLD and $\overline{RSPn}$ are set at "H" level to select one of the word line WL, as shown in FIG. 16. With this operation, if the signal BITAC/BITDC is at "L" level, there is no possibility that the spare word line SWLi and the word line WL are simultaneously selected. In contrast to this, in the AC burn-in test mode, if the signal BITAC is set at "H" level, both the signals $\overline{RSP}$ and RSP are set at "H" level when the address bit AiR is set at "H" level. Consequently, both the signals SWSn and $\overline{RSPn}$ rise together with the signal XVLD, so that both the spare word line SWLi and the word line WL are decoded by only the address bits A0R and AiR and are set at "H" level. As a result, AC stresses are applied to both the normal word line WL and the spare word line SWLi at the same duty ratio. In the DC burn-in test mode, when the signal BITDC is set at "H" level, all the bits of an internal row address signal are set at "H" level. As a result, both the signals $\overline{RSP}$ and RSP are set at "H" level. When the XVLD signal rises, both the signals SWSn and $\overline{RSPn}$ rise together, and hence all the spare word lines SWLi and the word lines WL rise. With this operation, DC stresses are applied to the normal word lines WL and the spare word lines SWLi in the same manner.

Figure 18:
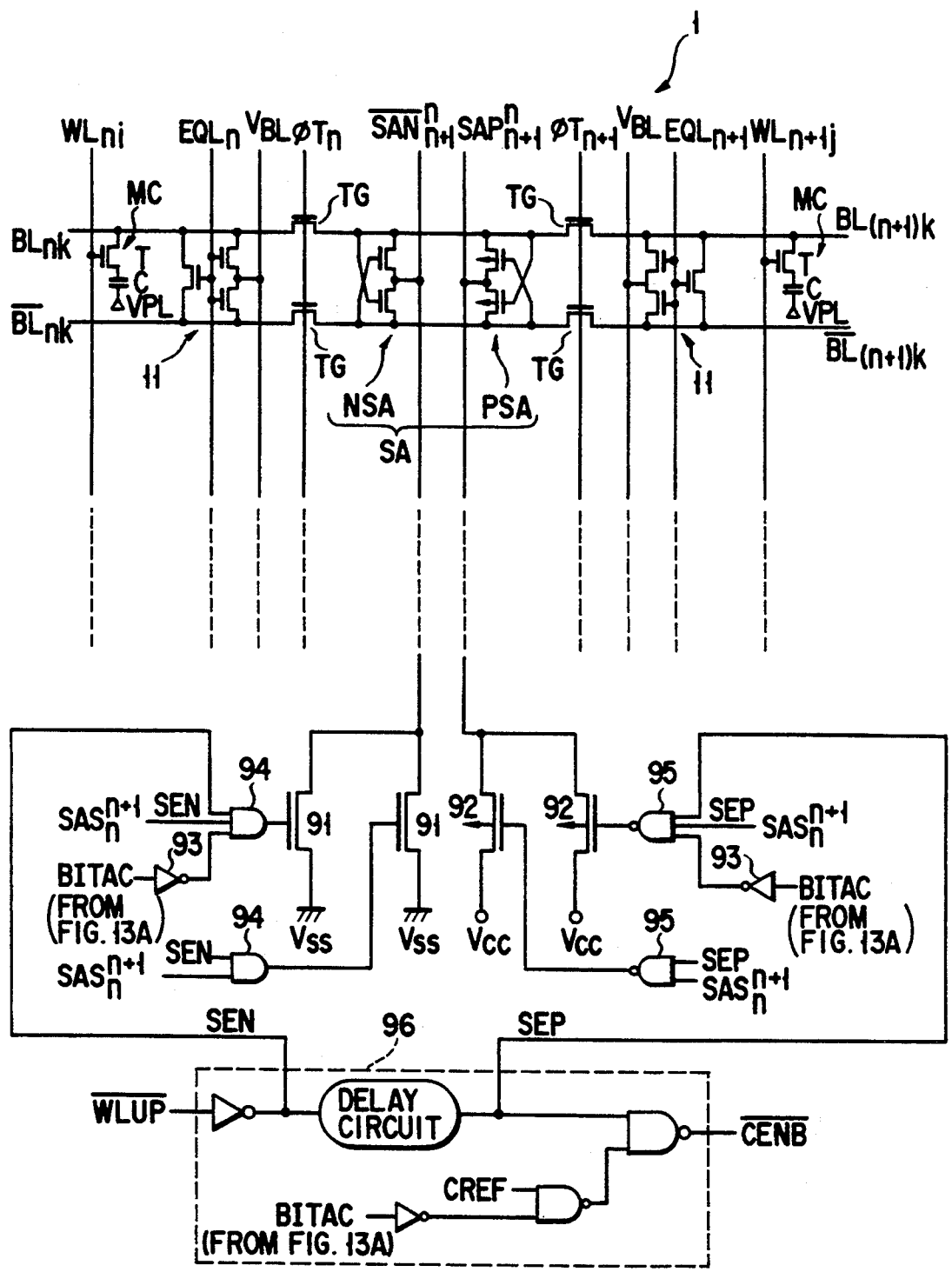
FIG. 18 is a circuit diagram showing a one-column portion of a memory cell array and part of a memory cell peripheral circuit in FIG. 4.
Figure 19:
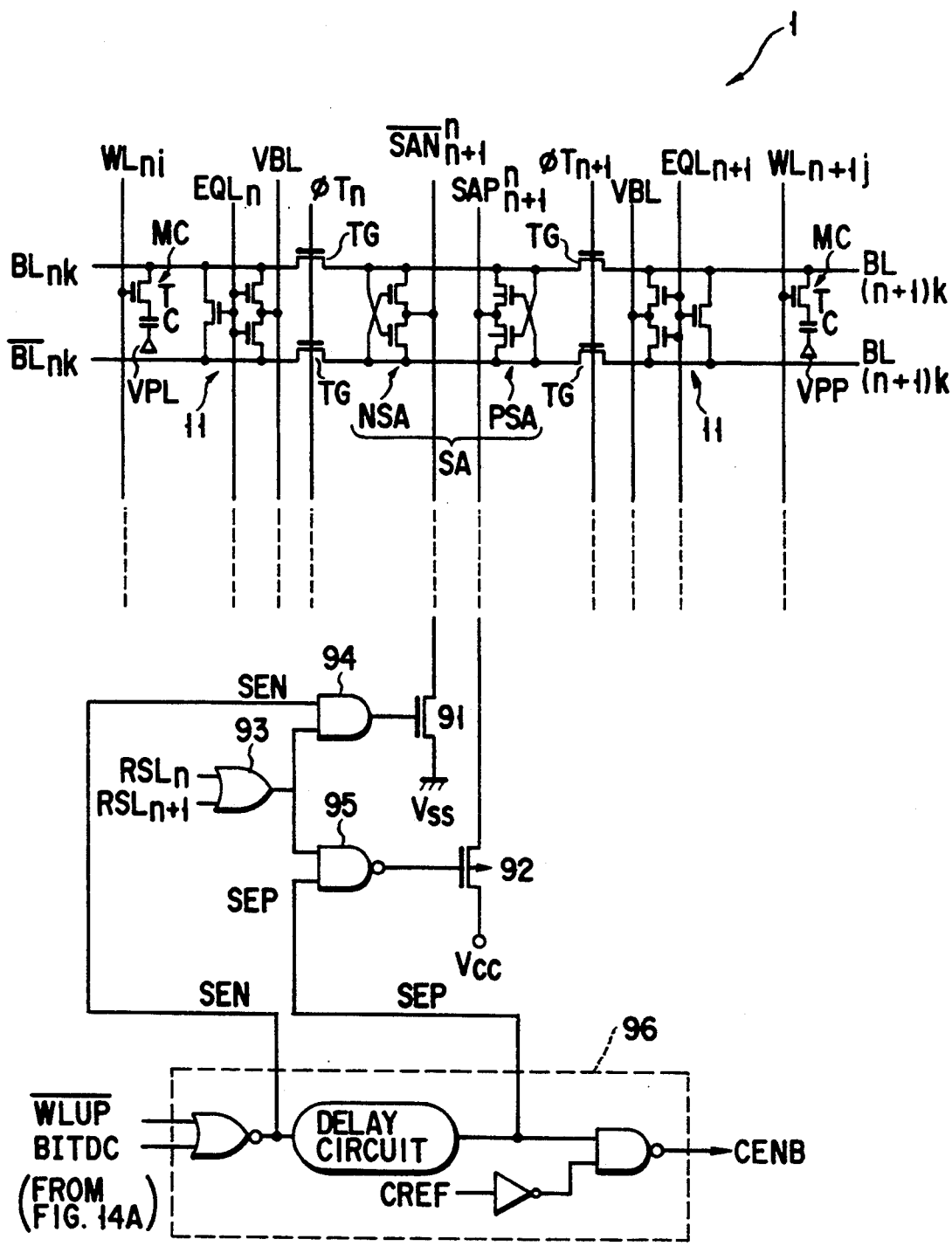
FIG. 19 is a circuit diagram showing a one-column portion of a memory cell array and part of a memory cell peripheral circuit in FIG. 4.

FIGS. 18 and 19 are circuit diagrams showing a one-column portion of the memory cell array 1 in FIG. 4 and part of a memory cell peripheral circuit. FIGS. 18 and 19 show two memory cells MC as representatives of the memory cells arranged in the form of a matrix. Each memory cell MC includes a capacitor C having one end connected to the source of a transfer gate NOS transistor (cell transistor), and the other end connected to a capacitor line (e.g., a plate potential VPL). Word lines WLni and WL(n+1)j (as two representative word Lines) are connected to the gates of the cell transistors T in the same row. Bit lines BLnk and $\overline{BLnk}$ (as one representative pair) are connected to the drains of the cell transistors T in the same column. As the sense amplifier SA, for example, a latch type circuit constituted by an n-channel sense amplifier NSA and a p-channel sense amplifier PEA is used. Reference numerals 91 denote two activation control (driving) transistors for the n-channel sense amplifier NSA; 92, two activation control (driving) transistors for the p-channel sense amplifier PSA; 93, inverters; 94, AND gates; and 95, NAND gates. Each bit line transfer gate TG is constituted by an NMOS transistor inserted between a pair of input nodes of a corresponding one of the sense amplifiers SA and a pair of bit lines BL and $\overline{BL}$. By inputting the transfer gate control signal $\phi T$ to the gate of this transistor, connection between the sense amplifiers SA and a pair of bit lines BL and $\overline{BL}$ is controlled. For the sake of simple illustration, a column selection circuit transfer gate controlled by a column selection line (not shown) to transfer information, amplified by the sense amplifier SA, to a data line pair (not shown) is omitted. The bit line precharging/equalizing circuit 11 is controlled by the bit line equalizing signal EQL to precharge a pair of bit lines BL and $\overline{BL}$ on both sides of the sense amplifier SA to the bit precharging voltage VBL, thus equalizing their potentials. A $\overline{CENB}$ signal generating circuit 96 generates a signal $\overline{CENB}$ for activating the operations of the sense amplifier SA and a circuit on the output side (e.g., in a read operation, a column address is loaded to cause a column selection line to rise, and a buffer circuit (not shown) connected to a data line pair is activated to amplify information of the data line pair and transfer the information to an output buffer circuit (not shown), thus outputting the information outside the chip).

The circuit shown in FIG. 18 is logically designed to realize the following operation. In a normal operation in which the signal BITAC is at "L" level, when a sense amplifier activating signal SEN rises, the n-channel sense amplifier NSA is activated while the driving transistors 91 for the n-channel sense amplifier NSA are optimized (in the embodiment, the amplifier is activated by the sum of the driving forces of the two driving transistors 91). When a sense amplifier activating signal SEP rises, the p-channel sense amplifier PSA is activated while the driving transistors 92 for the p-channel sense amplifier PSA are optimized (in the embodiment, the amplifier is activated by the sum of the driving forces of the two driving transistors 92). Thereafter, if a signal CREF is at "L" level, the signal $\overline{CENB}$ goes to "L" level to start the operation of the column system. Note that in a CBR cycle, the signal CREF is set at "H" level, and the signal $\overline{CENB}$ is kept at "H" level to inhibit the operation of the column system. When the signal BITAC is set at "H" level, both the n- and p-channel sense amplifiers NSA and PSA are activated by a limited driving force (the driving force of one driving transistor 91 and that of one driving transistor 92, respectively, in the embodiment). With this control, large noise can be prevented even if a large number of sense amplifiers SA operate at the same time and a large current flows in each amplifier. If the signal BITAC is at "H" level, since the signal $\overline{CENB}$ is kept at "L" level even in a CBR cycle, the operation of the column system is not inhibited.

The circuit shown in FIG. 19 is logically designed to realize the following operation. In a normal operation in which the signal BITDC is at "L" level, when the sense amplifier activating signal SEN rises, the n-channel sense amplifier NSA is activated. When the sense amplifier activating signal SEP rises, the p-channel sense amplifier PSA is activated. Thereafter, the signal $\overline{CENB}$ goes to "L" level to start the operation of the column system. When the signal BITDC is set at "H" level, neither of the n- and p-channel amplifiers NSA and PSA are activated, and the signal $\overline{CENB}$ is kept at "H" level to inhibit the operation of the column system.

FIG. 20 is a circuit diagram showing a signal generating circuit for generating the signals $\phi T$ and EQL in FIG. 18. Referring to FIG. 20, reference numerals 100 and 101 denote differential circuits; 102 to 108, inverters; and 109 to 111, NAND gates. A signal WLDOWN is kept at "H" level until the word line WL rises.

The circuit shown in FIG. 20 is logically designed to realize the following operation. In a normal operation in which the BITAC signal is at "L" level, a signal BLHZ signal is set at "L" level in synchronism with a signal $\overline{RSTR}$ which is set at "L" level immediately after the signal $\overline{RAS}$ (the signal WLDOWN is irrelevant in this case because it is kept at "H" level until the word line WL rises) in a block selected by the block selection signal RSLn. As a result, the equalizing operation of a pair of bit lines $\overline{BL}$ of the selected memory cell block is stopped to wait for the word line WL to rise. When the signal BITAC is set at "H" level, the signal $\phi T$ is forcibly clamped to "H" level for the following reason. In the shared sense amplifier scheme, if adjacent memory cell blocks are simultaneously activated, the signal $\phi T$ is turned off in both the blocks. As a result, data cannot be amplified by the sense amplifier SA. Alternatively, in the shared sense amplifier scheme, in order to prevent simultaneous activation of adjacent memory cell blocks, the row address counter for selecting adjacent memory cell blocks is arranged immediately above the address counter for the address bits A0 and A1 to perform address replacement, thereby allowing all the word lines WL to rise once for every eight CBR cycles. In this case, even in the AC burn-in test mode, the signal $\phi T$ need not be forcibly clamped to "H" level. As is apparent, in a scheme (other than the shared sense amplifier scheme) in which a special sense amplifier SA is arranged for each memory cell block, if the signal $\phi T$ is not used, the above-described consideration need not be given.

Figure 21:
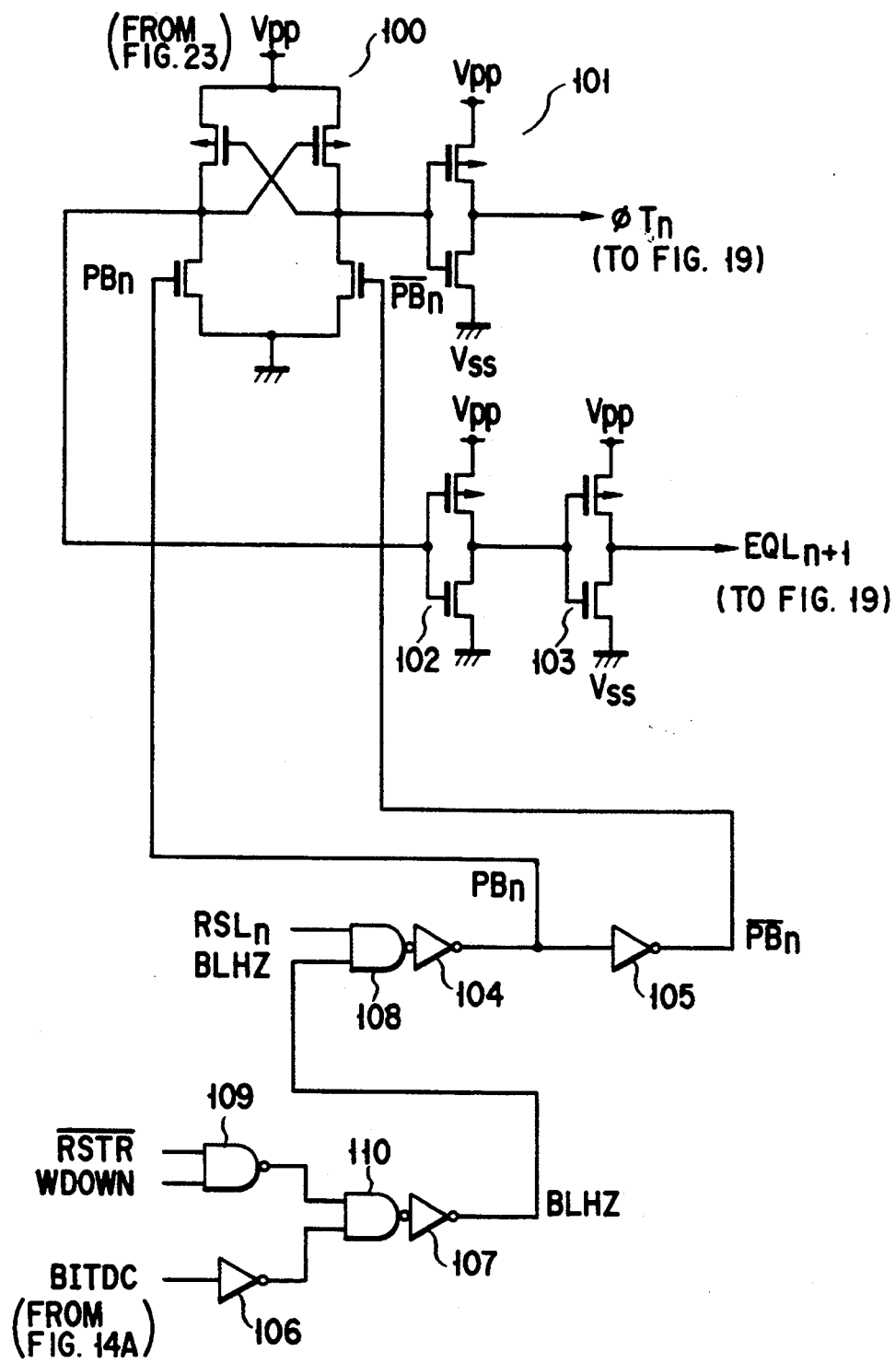
FIG. 21 is a circuit diagram showing a signal generating circuit for generating signals $\phi T$ and EQL in FIG. 19.

The circuit shown in FIG. 21 is logically designed to realize the following operation. In a normal operation in which the signal BITDC is at "L" level, a signal BLHZ signal is set at "L" level in synchronism with a signal $\overline{RSTR}$ which is set at "L" level immediately after the signal $\overline{RAS}$ (the signal WLDOWN is irrelevant in this case because it is kept at "H" level until the word line WL rises) in a block selected by the block selection signal RSLn. As a result, the equalizing operation of a pair of bit lines $\overline{BL}$ of the selected memory cell block is stopped to wait for the word line WL to rise. When the signal BITDC is set at "H" level, both the signals $\phi T$ and EQL are clamped to "H" level. With this operation, all the pairs of bit lines BL and $\overline{BL}$ are see at the bit precharging voltage VBL.

FIG. 22 is a circuit diagram exemplifying the VBL generating circuit 12 in FIG. 4. Referring to FIG. 22, reference symbols P2 to P5 denote PMOS transistors; N6 to N10, NMOS transistors; and 111, an inverter circuit.

The circuit in FIG. 22 is designed to realize the following operation. In a normal operation in which the signal BITDC is at "L" level, a potential VBL of 0.5 Vcc is output. When the signal BITDC is set at "H" level, the potential VBL is forcibly set at "L" level, thus fixing all the pairs of bit lines BL and $\overline{BL}$ to "L" level.

FIG. 23 is a circuit diagram exemplifying the word line driving voltage source 7 (VPP generating circuit) and the VPP-VCC short circuit 14 in FIG. 4. Referring to FIG. 23, reference numeral 120 denotes a booster circuit for generating a potential VPP; 121, an inverter circuit; and 122, a NOR gate. Reference symbol CP denotes a capacitive element; D, a diode; R1 and R2, resistive elements; 123, a PMOS transistor; 124, a differential circuit; and 125, a comparator.

The circuit shown in FIG. 23 is designed to realize the following operation. In a normal operation in which the signal BITAC/BITDC is at "L" level, the PMOS transistor 123 between a VPP line and a VCC line in an OFF state, and the booster circuit 120 between he VPP line and the VCC line operates to boost the word line driving voltage VPP to a limit potential corresponding to a reference potential Vref1 in the chip. When the signal BITAC/BITDC is set at "H" level, the booster circuit 120 is inactivated, and the VPP-VCC short circuit 14 is activated instead. As a result, the word line driving potential VPP becomes equal to the external supply potential VCC.

Figure 24:
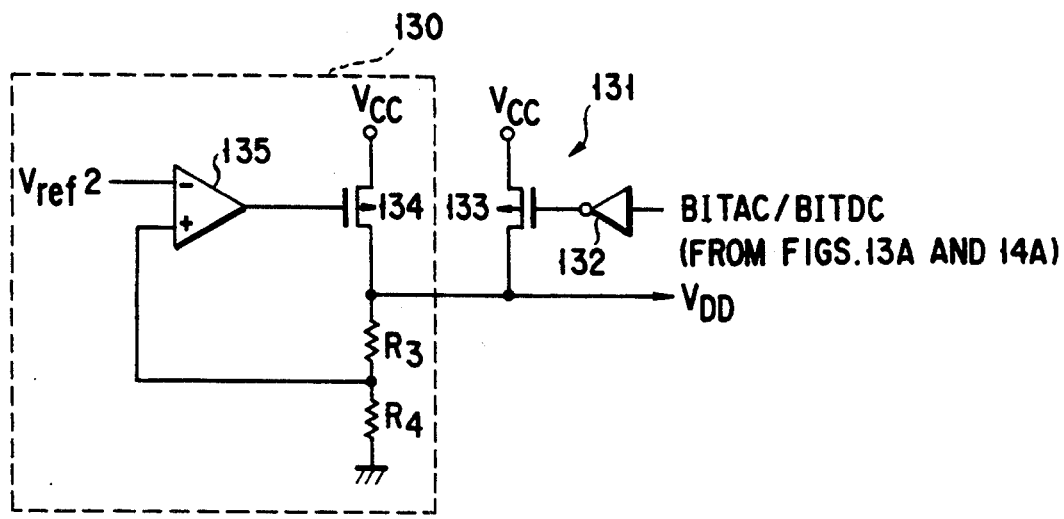
FIG. 24 is a circuit diagram showing a supply voltage decreasing circuit and a VCC-VDD short circuit arranged in a DRAM according to the second embodiment of the present invention.

A DRAM according to the second embodiment of the present invention will be described next, which uses a voltage decreasing circuit for applying a supply voltage VCC, applied from the outside of the chip, as a word line driving voltage, and applying an internal decreased voltage VDD, obtained by decreasing the supply voltage VCC on the chip, as power to a memory cell peripheral circuit. In the DRAM of the second embodiment, as shown in FIG. 24, a VCC-VDD short circuit 131 is preferably arranged to connect the output node of a voltage decreasing circuit 130 and an external power terminal by, e.g., short-circuiting in the AC/DC burn-in test mode. With this arrangement, in the AC/DC burn-in test mode, not only a voltage stress on the transfer gate of each memory cell but also a voltage stress on the insulating film of each transistor of other circuits can be increased to values higher than those in a normal operation, thereby accelerating the voltage stresses.

FIG. 24 is a circuit diagram exemplifying the voltage decreasing circuit 130 and the VCC-VDD short circuit 131. Referring to FIG. 24, reference numeral 132 denotes an inverter; 133 and 134, PMOS transistors; and 135, comparators. Reference symbols R3 and R4 denote resistive elements.

Figure 25:
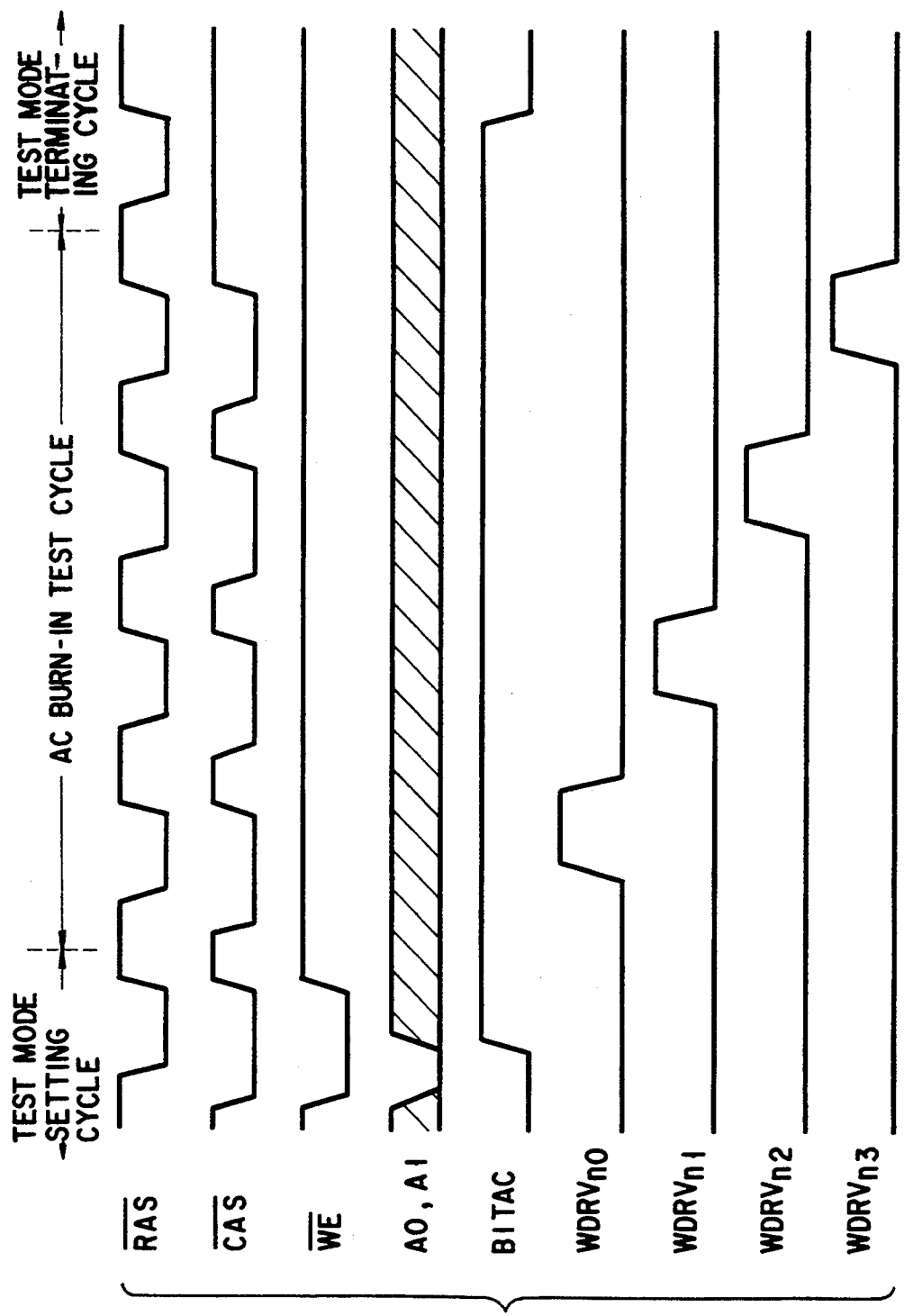
FIG. 25 is a timing chart showing a cycle for setting the quick AC burn-in test mode, an AC stress test cycle, and a test terminating cycle with respect to the DRAM of the present invention.

FIG. 25 is a timing chart showing a cycle for setting a quick AC burn-in test mode, an AC stress test cycle, and a cycle for terminating a test in the above-described DRAM of the present invention. The quick AC burn-in test mode is executed according to the following steps.

In the first step, the same data is written in memory cells connected to a sense amplifier SA through a bit line BL in a normal write mode.

In the second step, a WCBR cycle is executed while address signal bits A0R and A1R are set at "L" level, thereby generating an AC burn-in test mode signal.

In the third step, the following setting is performed. Signals CTj and $\overline{CTj}$ (j=figures other than 0 and 1) are set at "L" level. The driving force of the sense amplifier SA is restricted. VPP=VCC is set. VDD=VCC is set (if the voltage decreasing circuit is used). However, in the shared sense amplifier scheme, bits of the signal CTj or $\overline{CTj}$, other than those indicated by j=0, 1, and 2, are set at "L" level. A signal $\phi T$ is set at "H" level.

In the fourth step, a time interval tRP (several $\mu$s) long enough to complete the setting of the voltages VPP and VDD in the third step is ensured.

In the fifth step, the voltage VCC is boosted to a high voltage for performing a burn-in test.

In the sixth step, an AC stress is applied to the word lines WL for a required period of time the number of times corresponding to a plurality of sets, each set consisting of four or eight CBR cycles.

In the seventh step, a clock for an ROR cycle is input to terminate the AC burn-in test mode.

Figure 26:
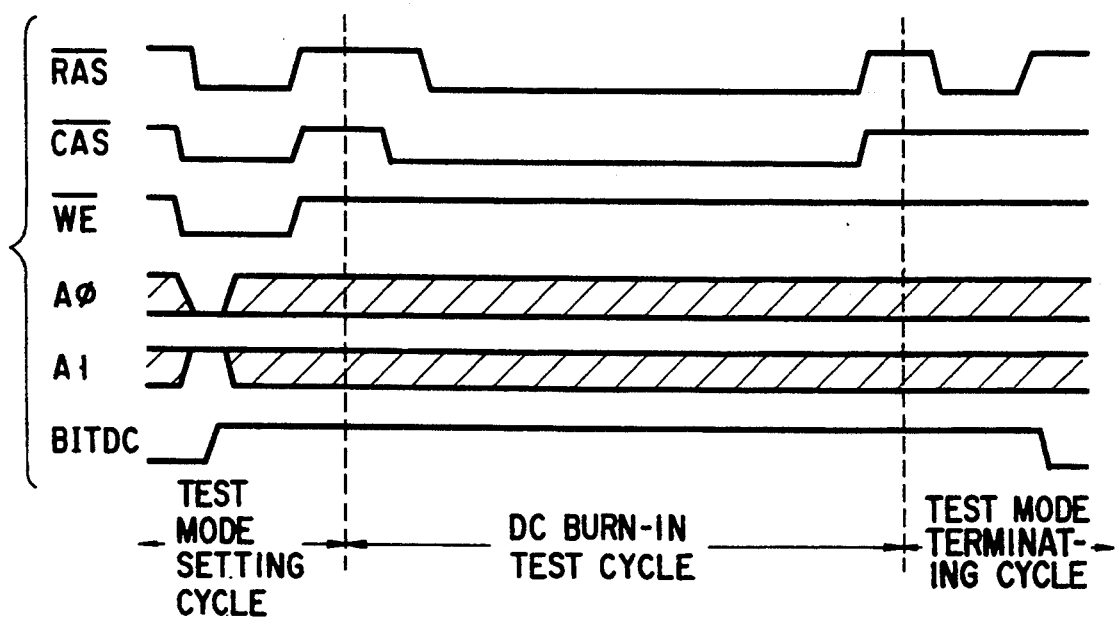
FIG. 26 is a timing chart showing a cycle for setting the quick DC burn-in test mode, a DC stress test cycle, and a test terminating cycle with respect to the DRAM of the present invention.

FIG. 26 is a timing chart showing a cycle for setting a quick DC burn-in test mode, a DC stress test cycle, and a cycle for terminating a test in the above-described DRAM of the present invention. The quick DC burn-in test mode is executed according to the following steps.

In the first step, a WCBR cycle is executed, while the address signal bits A0R and A1R are set at "L" level and "H" level, respectively, thus generating a test mode signal.

In the second step, the following setting is performed. The signals CTj and $\overline{CTj}$ are set at "L" level. A signal EQL and the signal $\phi T$ are set at "H" level. Signals SEP and SEN are set at "L" level. The potential VBL is set at "L" level. VPP=VCC and VDD=VCC are set (if the voltage decreasing circuit is used).

In the third step, a time interval tRP (several $\mu$s) long enough to complete the setting of the voltages VBL, VPP, and VDD in the second step is ensured.

In the fourth step, the voltage VCC is boosted to a high voltage for performing a burn-in test.

In the fifth step, a long CBR cycle is executed to simultaneously apply a DC stress to all the word lines WL for a required period of time.

In the sixth step, a clock for an ROR is input to terminate the DC burn-in test mode.

In the above-described embodiments, the voltage stress test in the burn-in test mode is exemplified. It is, however, apparent that the present invention is effective in performing a voltage stress test regardless of temperature acceleration.

Figure 27:
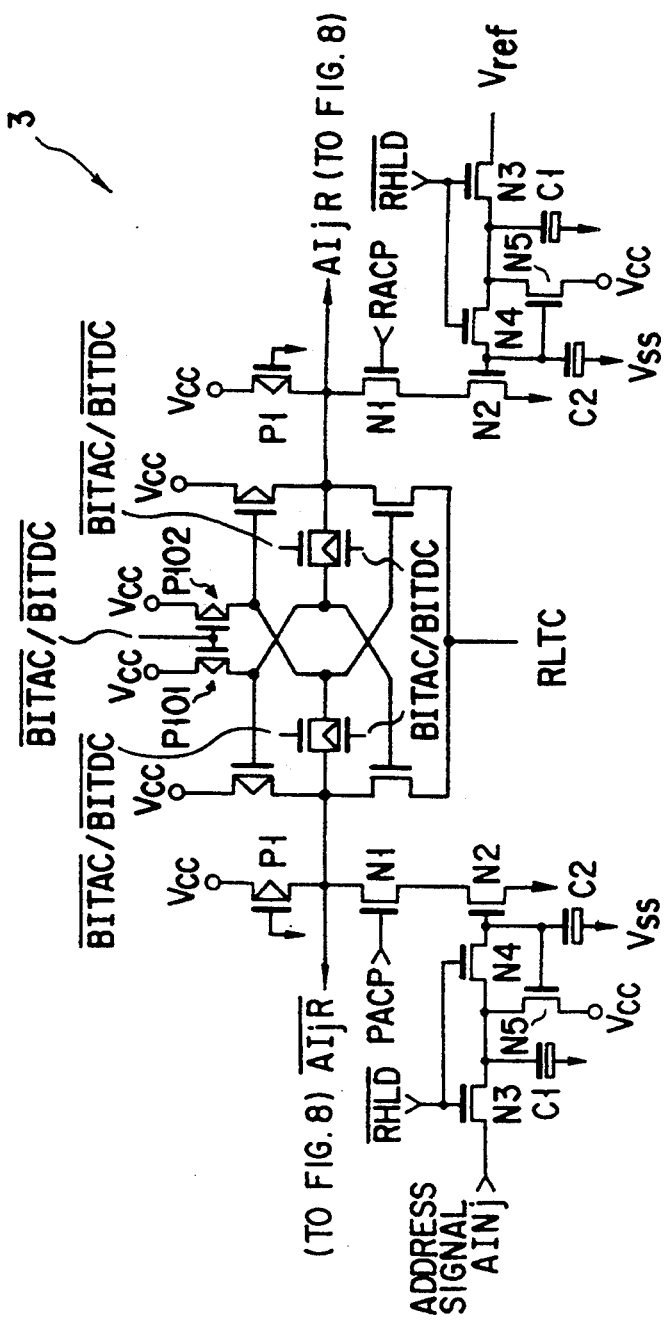
FIG. 27 is a circuit diagram showing part of another row address buffer circuit in FIG. 4.

FIG. 27 is a circuit diagram showing a modification of part of the row address buffer (corresponding to one bit) of the address buffer circuit 3 shown in FIG. 4. In FIG. 27, the components identical to those shown in FIG. 5 are denoted by the same numerals. In the modification of FIG. 27, the BITDC and $\overline{BITDC}$ signals are input to all row address buffers in the DC burn-in test mode. Since the DC burn-in test mode signal BITDC is "high" and the signal $\overline{BITDC}$ is "low" the gate node common to the P-channel and N-channel transistors of the flip-flop circuit is electrically isolated from the output nodes (AIjR, $\overline{AIjR}$) and subsequently set at the potential Vcc by the two P-channel transistors P101 and P102. Hence, when the latch control signal RLTC falls to the low level during the normal $\overline{RAS}$ cycle, both row address buffer output signals AIjR and $\overline{AIjR}$ fall to the low level. Consequently, any row address can no longer be selected and all word lines WLs of all blocks are selected simultaneously. On the other hand, in the AC burn-in test mode, the lower order row addresses AI$_0$R and AI$_1$R required for selecting every forth word line WL are inputted into the row address buffer shown in FIG. 5 instead of the row address buffer shown in FIG. 27. In other words, the row address buffer of FIG. 5 is used to output the output signals AI$_0$R, $\overline{AI_0R}$, and the output signals AI$_1$R, $\overline{AI_1R}$, whereas the row address buffer of FIG. 27 is employed to output the output signals AI$_2$R and $\overline{AI_2R}$ and output signals of higher orders. The input signals to the row address buffer shown in FIG. 27 are the AC burn-in test mode signals BITAC and $\overline{BITAC}$, not the DC burn-in test mode signals BITDC and $\overline{BITDC}$. Under these condition, when addresses A$_0$ and A$_1$ are sequentially input to the DRAM circuit 10 from an external device during the $\overline{RAS}$ cycle, every fourth word line WL will be selected and the DRAM circuit 10 will be operated in the AC burn-in test mode.

As has been described above, according to the semiconductor storage device of the present invention, in setting the AC voltage stress test mode in which the duty ratio at which a high voltage is applied to word lines in a wafer state or after packaging is high, no special voltage stress test pads are required, and the number of circuits other than those required for the normal operation mode can be minimized, thereby suppressing an increase in chip area. In addition, failure modes which can occur in a normal operation but are difficult to predict, such as a decrease in breakdown voltage between adjacent word lines or adjacent bit lines, can be simultaneously screened by operating the device in substantially the same manner as in a normal operation, thereby allowing quick screening of the overall chip under conditions similar to those in a normal operation. In addition, according to the semiconductor storage device of the present invention, in setting a desired DC voltage stress test mode in which the duty ratio at which a high voltage is applied to word lines in a wafer state or after packaging is high, no special voltage stress test pads are required, and the number of circuits other than those required for the normal operation mode can be minimized, thereby reducing an increase in chip area.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory device comprising:
   a DRAM circuit;
   a voltage stress test mode signal generating circuit for generating a voltage stress test mode signal on the basis of a predetermined signal input through some of external terminals used in a normal operation of said DRAM circuit; and
   a control circuit for receiving the test mode signal from said voltage stress test mode signal generating circuit, and performing control such that a plurality of bits of an output signal from a refresh address counter of said DRAM circuit are fixed at the same level, and bits other than the plurality of bits are subjected to a normal count operation.

2. A semiconductor memory device comprising:
   a DRAM circuit;
   a voltage stress test mode signal generating circuit for generating a voltage stress test mode signal on the basis of a predetermined signal input through some of external terminals used in a normal operation of said DRAM circuit; and a control circuit for receiving the test mode signal from said voltage stress test mode signal generating circuit, and performing control such that upper bits, of an output signal from a refresh address counter of said DRAM circuit, which are more significant than a specific bit are fixed at the same level, and lower bits which are less significant than the specific bit are subjected to a normal count operation.

3. A device according to claim 2, wherein said DRAM circuit comprises:

a memory cell array having a plurality of dynamic memory cells arranged in the form of a matrix;

word lines, each connected to said memory cells in the same row of said memory cell array;

bit lines, each connected to said memory cells in the same column of said memory cell array;

a bit line precharging circuit connected to said bit lines and ON/OFF-controlled by a bit line equalizing signal to precharge said bit lines to a bit line precharging potential;

external terminals to which a supply voltage, an address signal, and various control signals are externally input;

an address buffer circuit for amplifying an external address signal input through some of said external terminals;

a refresh address counter for generating a refresh address signal for a refresh operation of said memory cells;

an address switching circuit for selecting either an output signal from said refresh address counter or a row address signal output from said address buffer circuit;

a row decoder circuit having a word line selecting function for selecting an arbitrary row in accordance with an internal row address signal output from said address switching circuit;

a word line driving circuit, having at least one word line driving MOS transistor connected between a word line driving voltage source and said word lines, for driving said word lines in accordance with an output signal from said row decoder circuit; and a sense amplifier circuit for detecting information read out from said memory cells to said bit lines.

4. A device according to claim 3, wherein said DRAM circuit includes spare word lines and a spare row decoder/word line driving circuit for a fail-safe operation, and said control circuit further performs control to selectively drive said spare word lines at the same duty ratio as that for normal word lines in a voltage stress test.

5. A device according to claim 4, wherein said control circuit further performs control to limit a capacity of a driving transistor for said sense amplifier circuit.

6. A device according to claim 5, wherein said DRAM circuit includes a bit line transfer gate inserted between an input node of said sense amplifier circuit and said bit lines and ON/OFF-controlled by a control signal, and said control circuit further controls said bit line transfer gate in an ON state in a voltage stress test.

7. A device according to claim 3, wherein said word line driving voltage source is an external power supply for a semiconductor chip, and also serves as a booster circuit for generating a word line driving voltage by boosting a supply voltage, applied from the outside of said semiconductor chip, on said chip, and applying the word line driving voltage as power to said word line driving circuit.

8. A device according to claim 7, wherein said control circuit further performs control to connect an output node of said booster circuit to an external power supply terminal in a voltage stress test.

9. A device according to claim 3, wherein said DRAM circuit further includes a supply voltage decreasing circuit for decreasing a supply voltage, applied from the outside of a semiconductor chip, on said chip, and applying the decreased voltage as power to a memory cell peripheral circuit, and said control circuit further performs control to connect an output node of said supply voltage decreasing circuit to an external power supply terminal.

10. A device according to claim 3, wherein each of said dynamic memory cells includes a transfer gate constituted by an n-channel MOS transistor, and said driving MOS transistor for said word line driving circuit is a p-channel MOS transistor.

11. A semiconductor memory device comprising said DRAM circuit including:

a memory cell array having a plurality of dynamic memory cells arranged in the form of a matrix;

word lines, each connected to said memory cells in the same row of said memory cell array;

bit lines, each connected to said memory cells in the same column of said memory cell array:

a bit line precharging circuit connected to said bit lines and ON/OFF-controlled by a bit line equalizing signal to precharge said bit lines to a bit line precharging potential;

external terminals to which a supply voltage, an address signal, and various control signals are externally input;

an address buffer circuit for amplifying an external address signal input through some of said external terminals;

a refresh address counter the generating a refresh address signal for a refresh operation of said memory cells;

an address switching circuit for selecting either an output signal from said refresh address counter or a row address signal output from said address buffer circuit;

a row decoder circuit having a word line selecting function for selecting an arbitrary row in accordance with an internal row address signal output from said address switching circuit;

a word line driving circuit, having at least one word line driving MOS transistor connected between a word line driving voltage source and said word lines, for driving said word lines in accordance with an output signal from said row decoder circuit;

a sense amplifier circuit for detecting information read out from said memory cells to said bit lines;

a bit line transfer gate inserted between an input node of said sense amplifier circuit and said bit lines and ON/OFF-controlled by a control signal;

a voltage stress test mode signal generating circuit for generating a voltage stress test mode signal on the basis of a predetermined signal input through some of external terminals used in a normal operation of said DRAM circuit; and a control circuit for receiving the test mode signal from said voltage stress test mode signal generating circuit, and performing control such that all bits of an output signal from a refresh address counter of said DRAM circuit are fixed at the same level so as to cause a word line driving circuit of said DRAM circuit to simultaneously drive all word lines.

12. A device according to claim 11, wherein said DRAM circuit includes spare word lines and a spare row decoder/word line driving circuit for a fail-safe operation, and said control circuit further performs control to selectively drive said spare word lines in a voltage stress test.

13. A device according to claim 12, wherein said control circuit further performs control in a voltage stress test such that said bit line transfer gate and said bit line equalizing circuit are set in an ON state, and the bit line precharging potential is set at a low level so as to inhibit operations of said sense amplifier circuit and a circuit on an output side thereof.

14. A device according to claim 11, wherein said word line driving voltage source is an external power supply for a semiconductor chip, and also serves as a booster circuit for generating a word line driving voltage by boosting a supply voltage, applied from the outside of said semiconductor chip, on said chip, and applying the word line driving voltage as power to said word line driving circuit.

15. A device according to claim 14, wherein said control circuit further performs control to connect an output node of said booster circuit to an external power supply terminal in a voltage stress test.

16. A device according to claim 11, wherein said DRAM circuit further includes a supply voltage decreasing circuit for decreasing a supply voltage, applied from the outside of a semiconductor chip, on said chip, and applying the decreased voltage as power to a memory cell peripheral circuit, and said control circuit further performs control to connect an output node of said supply voltage decreasing circuit to an external power supply terminal.

17. A device according to claim 11, wherein each of said dynamic memory cells includes a transfer gate constituted by an n-channel MOS transistor, and said driving MOS transistor for said word line driving circuit is a p-channel MOS transistor.

* * * * *